(12) United States Patent
Seko et al.

(10) Patent No.: US 7,303,945 B2
(45) Date of Patent: Dec. 4, 2007

(54) METHOD FOR FORMING PATTERN OF STACKED FILM AND THIN FILM TRANSISTOR

(75) Inventors: Nobuya Seko, Tokyo (JP); Hitoshi Shiraishi, Tokyo (JP); Kenichi Hayashi, Tokyo (JP); Naoto Hirano, Tokyo (JP); Atsushi Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 282 days.

(21) Appl. No.: 10/999,125

(22) Filed: Nov. 30, 2004

(65) Prior Publication Data

US 2005/0156239 A1 Jul. 21, 2005

Related U.S. Application Data

(63) Continuation-in-part of application No. 10/446,713, filed on May 29, 2003, now Pat. No. 6,933,241.

(30) Foreign Application Priority Data

Jun. 6, 2002 (JP) ............................. 2002-165163

(51) Int. Cl.
  *H01L 21/84* (2006.01)
  *H01L 21/00* (2006.01)
(52) U.S. Cl. .................. 438/149; 438/151; 438/164; 438/673; 438/713; 438/714
(58) Field of Classification Search .................... None
See application file for complete search history.

(56) References Cited

U.S. PATENT DOCUMENTS 4,546,376 A 10/1985 Nakata et al.
5,241,207 A 8/1993 Toyoshima et al.
5,663,578 A 9/1997 Hsu et al.
5,668,379 A 9/1997 Ono et al.
5,723,371 A 3/1998 Seo et al.
5,728,259 A 3/1998 Suzawa et al.

(Continued)

FOREIGN PATENT DOCUMENTS

| JP | 01-100924 | 4/1989 |
|---|---|---|
| JP | 02-082579 | 3/1990 |
| JP | 09-263974 | 10/1997 |
| JP | 2001-332741 | 11/2001 |
| JP | 2003-131261 | 5/2003 |

*Primary Examiner*—Mary Wilczewski
*Assistant Examiner*—Khanh Duong
(74) *Attorney, Agent, or Firm*—McGinn IP Law Group, PLLC

(57) ABSTRACT

A method for forming a pattern of a stacked film, includes steps (a) to (e). The step (a) is forming sequentially a first base insulating film and a light shielding material on a transparent substrate. The step (b) is patterning the light shielding material to obtain a light shielding film with a first pattern. The step (c) is forming sequentially a second base insulating film, a semiconductor film and a first oxide film on a substrate. The step (d) is forming a resist pattern with a second pattern on the first oxide film. The step (e) is forming a pattern of a stacked film by dry etching the first oxide film and the semiconductor film, above the light shielding film. The stacked film includes the semiconductor film and the first oxide film. The dry etching includes an etching by using an etching gas and the resist pattern as a mask. The semiconductor film includes a taper angle which is controlled to be within predetermined range.

10 Claims, 15 Drawing Sheets

U.S. PATENT DOCUMENTS

| | | |
|---|---|---|
| 5,856,239 A | 1/1999 | Bashir et al. |
| 6,124,154 A | 9/2000 | Miyasaka |
| 6,235,214 B1 | 5/2001 | Deshmukh et al. |
| 6,399,286 B1 | 6/2002 | Liu et al. |
| 7,238,600 B2 * | 7/2007 | Yamazaki et al. .......... 438/163 |
| 2002/0066902 A1 | 6/2002 | Takatoku |
| 2004/0135216 A1 | 7/2004 | Suzawa et al. |

* cited by examiner

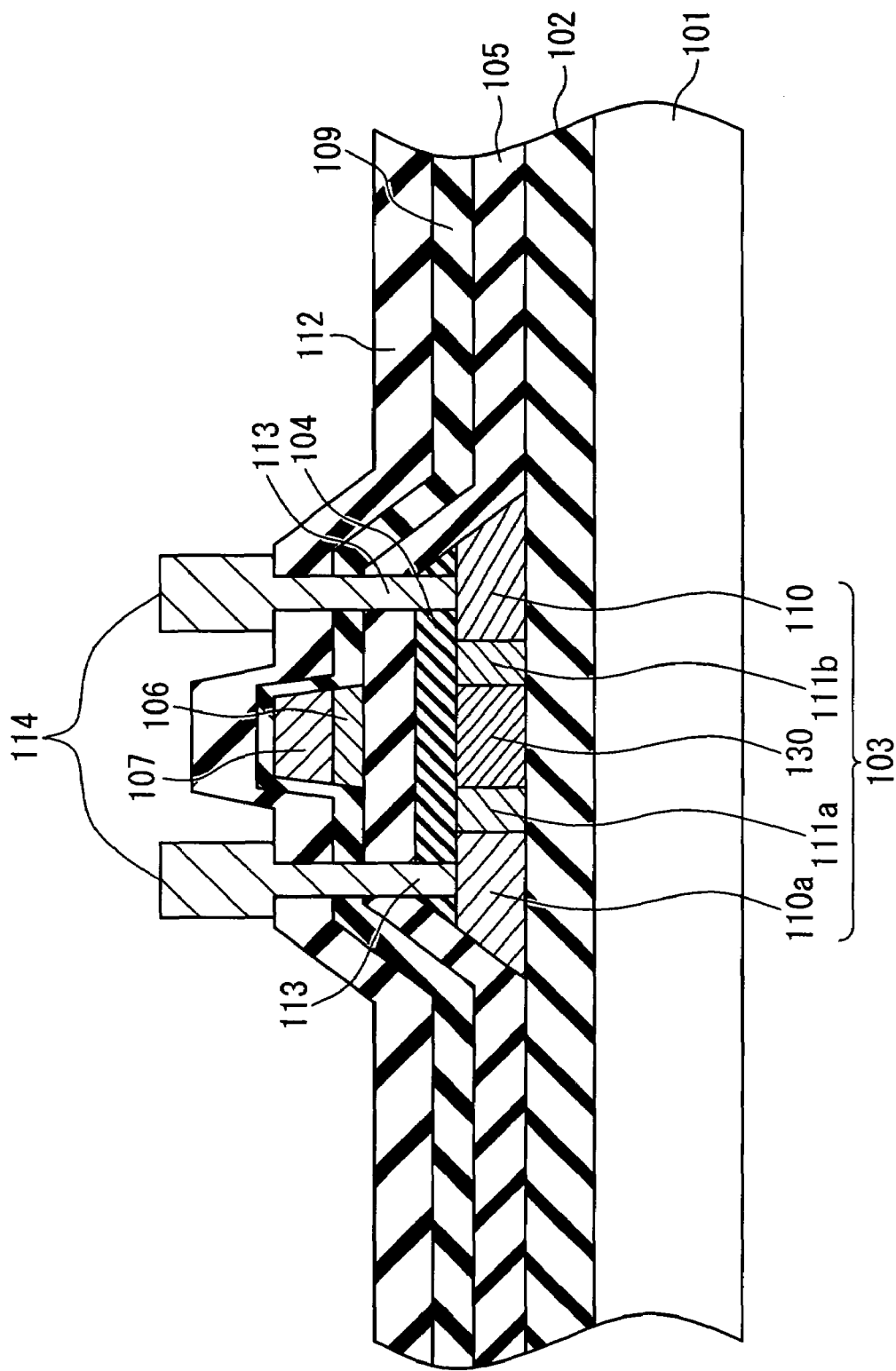

ISLAND (103, 104)

GATE ELECTRODE (106, 107)

$45° \leq \theta \leq 60°$
$10° \leq \gamma \leq 60°$

US 7,303,945 B2

METHOD FOR FORMING PATTERN OF STACKED FILM AND THIN FILM TRANSISTOR

CROSS REFERENCE TO RELATED APPLICATIONS

This application is a continuation-in-part of U.S. patent application Ser. No. 10/446,713 filed on May 29, 2003 now U.S. Pat. No. 6,933,241, the contents of which are hereby incorporated by reference. This application relates to U.S. patent application Ser. No. 10/855,394 filed on May 28, 2004, which is pending, the contents of which are hereby incorporated by reference.

BACKGROUND OF THE INVENTION

1. Field of the Invention

The present invention relates to a method for forming a pattern of a stacked film and a thin film transistor, and more particularly, to a method for forming a pattern of a stacked film composed of a polysilicon film and an upper oxide film and a thin film transistor having the stacked film.

2. Description of the Related Art

FIGS. 1A and 1B and FIGS. 2A and 2B illustrate schematic views of two-layer structures, each of which is composed of a polysilicon film and an upper oxide film for fabricating a conventional thin film transistor. FIG. 1A is a plan view of a two-layer structure, and FIG. 1B is a cross-sectional view obtained by cutting the two-layer structure of FIG. 1A along the line I-I. FIG. 2A is a plan view of a two-layer structure, and FIG. 2B is a cross-sectional view obtained by cutting the two-layer structure of FIG. 2A along the line II-II.

In each case, the lower oxide film (SiO2) 502 is deposited on the glass substrate 501 with a thickness of approximately 300 nm. Next, the silicon film 503 and the upper oxide film 504, which configure the two-layer structure, are deposited on the lower oxide film 502 with thicknesses of 60 m and 10 nm, respectively. Subsequently, the silicon film 503 is crystallized by an excimer laser, thus forming a polysilicon (poly-Si) film.

Next, dry etching is conducted simultaneously for the silicon film 503 and the upper oxide film 504, which configure the two-layer structure, followed by formation of the side face of the two-layer structure of the polysilicon film 503 with the thickness of 60 nm and upper oxide film 504 with the thickness of 10 nm at an angle of approximately 90° (vertical shape) with respect to the glass substrate.

The reason that the two-layer structure is composed of the polysilicon film and the upper oxide film is to protect the surface of the polysilicon film, which is an active layer, and keep the same surface clean. In addition, the reason that the film thicknesses in the two-layer structure are set at 10 nm for the upper oxide film and 60 nm for the polysilicon film is for thinning the film thickness of the upper oxide film as much as possible and facilitating the formation of the two-layer structure by dry etching. Detailed contents of this will be described later in a section of a method for forming a two-layer structure.

After the formation of the two-layer structure described above, high-concentration phosphorus ions are doped into the polysilicon film in the two-layer structure, thus forming a source/drain (not shown). Subsequently, low-concentration phosphorus ions are doped, thus forming a lightly doped drain (LDD). Thereafter, the gate oxide film 505 is formed in a thickness of 45 nm, followed by deposition of a two-layer film formed of a micro-crystalline silicon (μc-Si) film 506 and the Cr film 507. Then, the two-layer film is etched, thus forming the gate electrode 521. As the gate electrode 521, the Cr film 507 made of a metal with a high melting point is used because of its outstanding ability to resist heat, as well as its low electric resistance. Moreover, them μc-Si film 506, which has a specific work function, is used as an interlayer film because of its easiness in controlling threshold values. For the high melting point metal utilized as a gate material, W, Mo, Ti, Ta or a silicide film of any of these can be used as well as Cr. Thereafter, a heat treatment at a temperature of 350° C. or more is conducted, thus activating impurities contained in the polysilicon film of the two-layer structure, into which the phosphorus is doped. Thus, the electric resistance of the polysilicon in the portion into which the phosphorus is doped is lowered.

After the steps described above, a protective oxide film (not shown) is further deposited in a thickness of 300 nm. Then, a contact to communicate with the polysilicon film in the activated two-layer structure is opened in the protective oxide film and the gate oxide film, and Al wiring is formed thereon. Thus, a desired thin film transistor is obtained.

Next, a method for forming the foregoing two-layer structure will be described with reference to cross-sectional views of FIGS. 3A to 3C.

As a method for etching the foregoing upper oxide film and polysilicon film, a gas containing CF4 and O2 is used, and the entire upper oxide film 604 and a part of the polysilicon film 603 are simultaneously etched by reactive ions, using the photoresist 608 as a mask. The etching conditions in this case are set as:

Gas mixture ratio: $CF_4:O_2=4:1$
RF power: 700 W

In these etching conditions, the foregoing two-layer structure is etched close to vertically.

The residual polysilicon film is etched under the following etching conditions by use of the gas containing CF4 and O2:

Gas mixture ratio: $CF_4:O_2=4:1$
RF power: 300 W

Specifically, the RF power in the above conditions is lowered than that in the initial etching conditions. In this type of low RF power condition, an etching rate for the polysilicon film 603 is higher than that for the lower oxide film 602. Thus, the etching for the lower oxide film is restricted to the minimum. However, in this case, the etching rate for the upper oxide film on the polysilicon film 603 is simultaneously slowed. Hence, at the time when the etching for the polysilicon film is completed, the polysilicon film is overetched in the lateral direction with respect to the upper and lower oxide films, and the upper oxide film 604 is formed into a shape overhanging the polysilicon film 603.

In addition, after forming the two-layer structure, its surface is cleaned by a diluted hydrofluoric acid treatment for approximately 10 seconds, followed by deposition of the gate oxide film. The overhang of the oxide film, which is formed by etching the polysilicon film, can be removed by etching using the diluted hydrofluoric acid treatment because the film thickness of the upper oxide film is 10 nm. Because the etching rate by the diluted hydrofluoric acid treatment is several nm/min, the portion of the oxide film, which hangs during the work of immersion of the substrate for 10 seconds and pull-up thereof, is removed by etching from the upper and lower sides thereof. Hence, it is necessary to thin the film thickness of the two-layer structure to 10 nm (60 nm for the polysilicon film). If the film thickness of the upper oxide film is thickened more than 10 nm, then the time necessary for the diluted hydrofluoric acid treatment, required for removing the overhang, must be more than 10 seconds, and an excessive etching of the lower oxide film occurs on an interface between the polysilicon film and the lower oxide film. In addition, if the polysilicon film is thickened to more than 60 nm, then variations in etching in the case of selectively removing the polysilicon film by etching are increased, thus making it difficult to control the dimension of the polysilicon film and to switch off the TFT.

As described above, if the conventional process is used, then the excessive etching of the lower oxide film has hardly occurred under the polysilicon film, and the two-layer structure has been formed such that its side face can be close to vertical.

As shown in FIG. 2B which is the cross-sectional view obtained by cutting the plan view of FIG. 2A, the conventional two-layer structure is formed into a shape in which the side faces of the upper oxide film 504 and polysilicon film 503 are close to vertical with respect to the base.

Hence, if the three-layer film formed of the gate oxide film 505, the micro-crystalline silicon film 506 for the gate electrode and the Cr film 507 is deposited on the two-layer structure, the three-layer film is thickened on the two-layer structure and the lower oxide film excluding the same on the two-layer structure, and thinned on the sidewall portion of the two-layer structure. This means that the three-layer film does not sufficiently cover the sidewall step portion of the two-layer structure. As a result, a stress concentrates upon the three-layer film located on the sidewall of the two-layer structure, and the crack 515 occurs on the three-layer film. If the crack 515 exists on the three-layer film, then there is a possibility that a short-circuit of the gate electrode will occur in the portion of the crack 515 when the impurities contained in the polysilicon film in the two-layer structure are activated by use of a laser. Particularly, in the case of composing the gate electrode from a high melting point metal of a columnar structure, such as Cr, as in the present invention, the structure is weak against stress, and the crack 515 is more prone to occur.

In general, the surface of the polysilicon film configuring the two-layer structure is uneven, and its morphology is bad. Therefore, it is thought that the gate oxide film and the gate electrode on the two-layer structure are not evenly deposited and that the cracks become prone to occur on the thin portions of the gate oxide film and gate electrode.

An important purpose of forming the thin film transistor on the transparent substrate such as glass and quartz is to realize an optical device of a transparent-type. An active matrix-type liquid crystal display is the representative example which uses a thin film transistors for switches of pixels. The display has been used for a personal computer, a laptop computer, a cell phone, a mobile device such as a PDA and a flat panel-type TV. In these devices, the display is watched by naked eyes directly. Also, a projector has been popular in which the liquid crystal display is incorporated into an extended projection optical system.

In case of the direct view-type display, a backlight is placed in the back of the display, and the display is viewed directly. In case of using the liquid crystal display (the liquid crystal light valve) for the projector, strong light is irradiated to the liquid crystal display compared with the direct view-type display. For example, if the intensity of the light is calculated simply based on the area ratio, in case that a picture on an one-inch panel is extended to a screen corresponding to 100-inch display by the projector in order to obtain the same brightness of a direct view-type display with 15-inch, the following result is obtained. That is, at a unit area of the panel, the light having the intensity to exceed by 2,000,000 times than that of the direct view-type display is incident to the liquid crystal light valve.

In the active matrix-type liquid crystal display, one of the problems related to light is leak current (light leak current) caused by the generation of electric carriers of the light excitation in response to light reaching to the thin film transistors. The thin film transistor as a switch of the pixel is turned off after applying a writing voltage to the pixel and must maintain the voltage until the following writing. However, the written voltage has declined when the light leak current is large and brings about the decline of the contrast.

To restrain such a light leak current, a semiconductor layer (hereinafter also referred to as an island) which functions as the activated layer of the thin film transistor doesn't directly form on the base insulating film on the transparent substrate. After forming a light shielding film on the base insulating film, the semiconductor layer is formed on another base insulating film. The light shielding film is made of light shielding materials such as metallic materials. That is, the structure is used in which the light shielding film blocks off light from under the transparent substrate.

In conjunction with the above description, Japanese Laid Open Patent Application (JP-A-Heisei 9-263974) discloses the following a method of etching a Cr film. The etching method is the method for the Cr film formed on the substrate. The method includes three processes. The first process is to form a resist in a certain area on the Cr film. The second process is to remove the Cr film in the area where the resist isn't formed, by the wet etching. The third process is to remove proper amount of the resist and the exposed surface of the Cr film on which the resist is not left to make the section of the Cr film a taper, by the dry etching. In the dry etching, the mixed gas of chloric-group gas and oxygen may be used as etchant.

In the thin film transistor having the structure which has the light shielding film under the island and using the same, the electric potential of the light shielding film acts on the island. That influences the operation of the thin film transistor.

SUMMARY OF THE INVENTION

Therefore, an object of the present invention is to provide a method of forming a pattern of a stacked film and a thin film transistor which suppress the influence that the electric potential of a light shielding film affects to an operation of the thin film transistor, in the thin film transistor having a structure which has the light shielding film under an island of a semiconductor.

Another object of the present invention is to provide a method of forming a pattern of a stacked film and a thin film transistor which reduce operation malfunctions and display defects, and improves production yield and reliability to reduce a cost.

Still another object of the present invention to provide, with regard to a stacked structure of a lower oxide film, a semiconductor film and an upper oxide film, a method for forming a pattern of a stacked film composed of a semiconductor film and an upper oxide film, the pattern of the stacked film being capable of absorbing a physical stress on an insulating film and wiring, which cover the pattern of the stacked film, and capable of preventing a crack of the insulating film and a disconnection.

This and other objects, features and advantages of the present invention will be readily ascertained by referring to the following description and drawings.

In order to achieve an aspect of the present invention, the present invention provides a method for forming a pattern of a stacked film, including: (a) forming sequentially a first base insulating film and a light shielding material on a transparent substrate; (b) patterning the light shielding material to obtain a light shielding film with a first pattern; (c) forming sequentially a second base insulating film, a semiconductor film and a first oxide film on a substrate; (d) forming a resist pattern with a second pattern on the first oxide film; and (e) forming a pattern of a stacked film by dry etching the first oxide film and the semiconductor film, above the light shielding film. The stacked film includes the semiconductor film and the first oxide film. The dry etching includes an etching by using an etching gas and the resist pattern as a mask. The semiconductor film includes a taper angle which is controlled to be within predetermined range.

In the method for forming a pattern of a stacked film, the etching gas may include a mixture gas of $CF_4$ and $O_2$. In the method for forming a pattern of a stacked film, an $O_2$ gas ratio of the etching gas may be smaller than that of a mixture gas whose gas ratio of $CF_4$ and $O_2$ is 100:100.

In the method for forming a pattern of a stacked film, the step (e) may include: (e1) forming the pattern of the stacked film such that the semiconductor film includes the taper angle in the range from 40° to 60°.

In the method for forming a pattern of a stacked film, a gas ratio of $CF_4$ and $O_2$ of the etching gas may be in the range from 110:90 to 120:80.

In the method for forming a pattern of a stacked film, the gas ratio of $CF_4$ and $O_2$ of the etching gas may be approximately 115:85.

In the method for forming a pattern of a stacked film, the step (c) may include: (c1) forming an amorphous silicon film on the second base insulating film, and (c2) annealing the amorphous silicon film by a laser to obtain a polysilicon film as the semiconductor film.

In the method for forming a pattern of a stacked film, the step (c) may include: (c3) forming an amorphous silicon film on the second base insulating film, (c4) forming the first oxide film on the amorphous silicon film, and (c5) annealing the amorphous silicon film by a laser to obtain a polysilicon film as the semiconductor film.

The method for forming a pattern of a stacked film, may further include: (f) forming a gate insulating film on the pattern of the stacked film and (g) forming wiring on the gate insulating film. The wiring crossing over the pattern of the stacked film.

In the method for forming a pattern of a stacked film, the wiring may include a metal selected from a group consisting of Cr, W, Mo, Ti, Ta and silicide films thereof.

In order to achieve another aspect of the present invention, the present invention provides a stacked film for thin film transistor, the stacked film including: a semiconductor film and a first oxide film. The semiconductor film is formed on a base insulating film and includes a taper angle in the range from 40° to 60°. The first oxide film is formed on the semiconductor film. The base insulating film is formed on a transparent substrate and includes a patterned light shielding film. The semiconductor film is formed above the patterned light shielding film.

In order to achieve still another aspect of the present invention, the present invention provides a thin film transistor including: a base insulating film and a stacked film. The base insulating film is formed on a transparent substrate and includes a patterned light shielding film. The stacked film is formed on the base insulating film. The stacked film includes: a semiconductor film and a first oxide film. The semiconductor film is formed on a base insulating film above the patterned light shielding film and includes a taper angle in the range from 40° to 60°. The first oxide film is formed on the semiconductor film.

BRIEF DESCRIPTION OF THE DRAWINGS

FIG. 4 is a cross-sectional view showing a configuration of a thin film transistor of the embodiments according to the present invention;

FIG. 6A is the plane view and FIG. 6B is the cross-sectional view along a line I-I in FIG. 6A;

FIG. 7A is the plane view and FIG. 7B is the cross-sectional view along a line I-I in FIG. 7A;

DETAILED DESCRIPTION OF THE PREFERRED EMBODIMENTS

First Embodiment

Figure 1A:
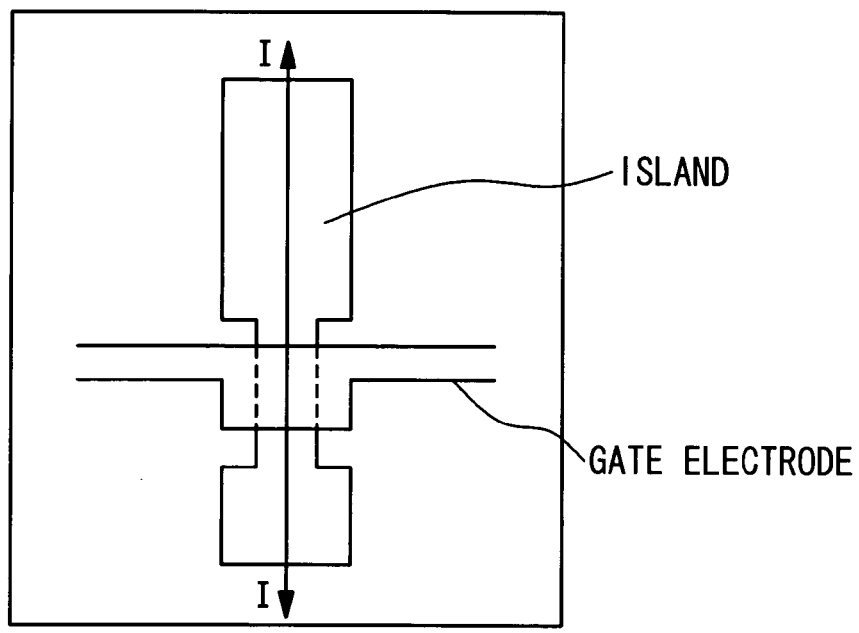
FIG. 1A is a plan view showing a two-layer structure of a conventional example.
Figure 1B:
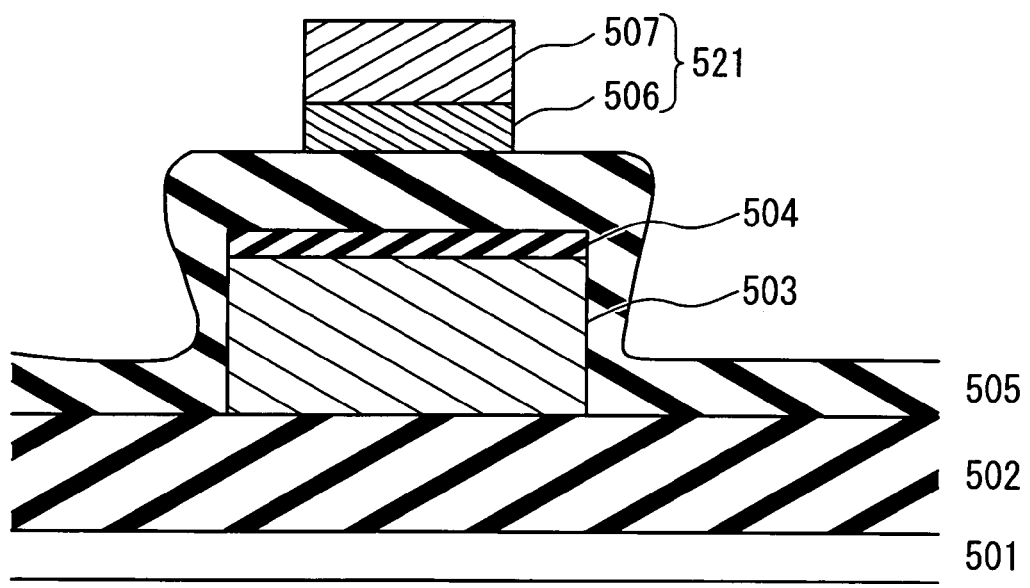
FIG. 1B is a cross-sectional view along a line I-I of FIG. 1A.
Figure 2A:
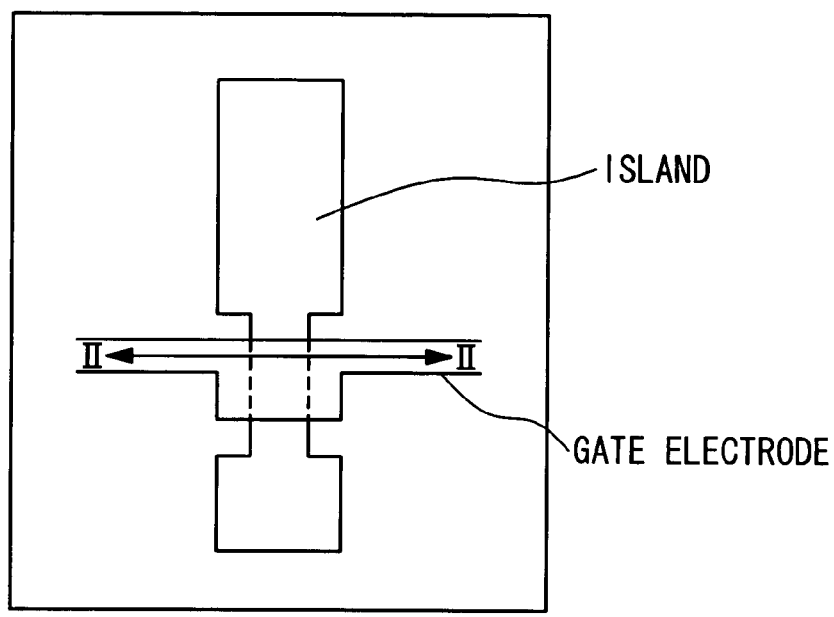
FIG. 2A is a plan view showing the two-layer structure of the conventional example.
Figure 2B:
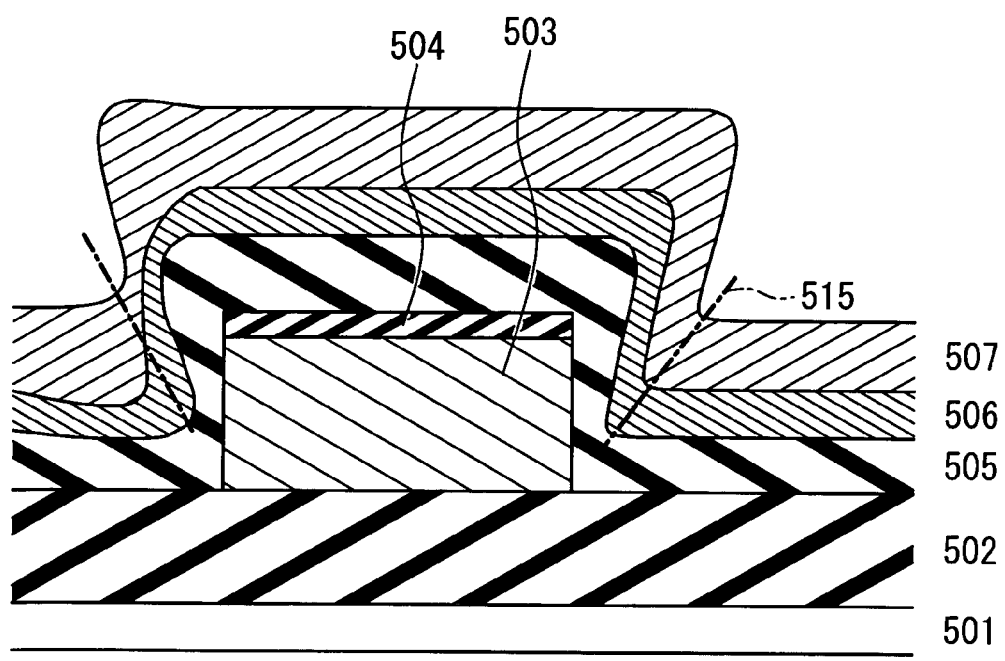
FIG. 2B is a cross-sectional view along a line II-II of FIG. 2A.
Figure 3A:
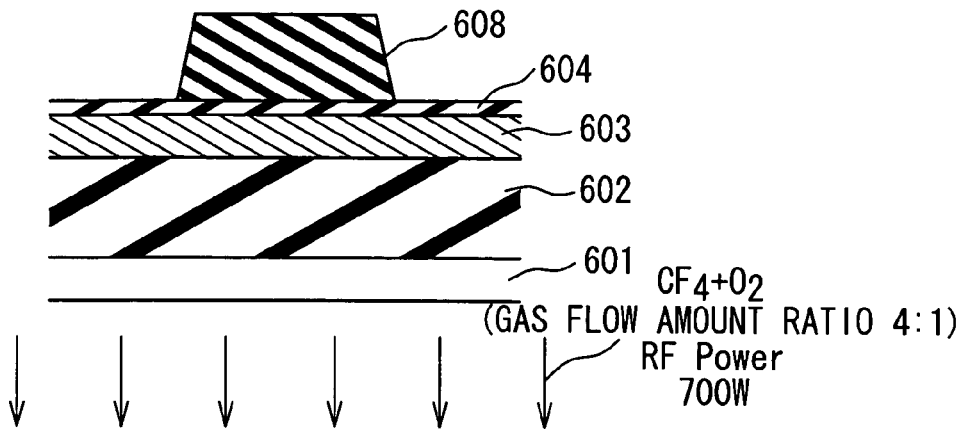
FIGS. 3A to 3C are cross-sectional views showing a method for forming the two-layer structure of the conventional example.
Figure 3B:
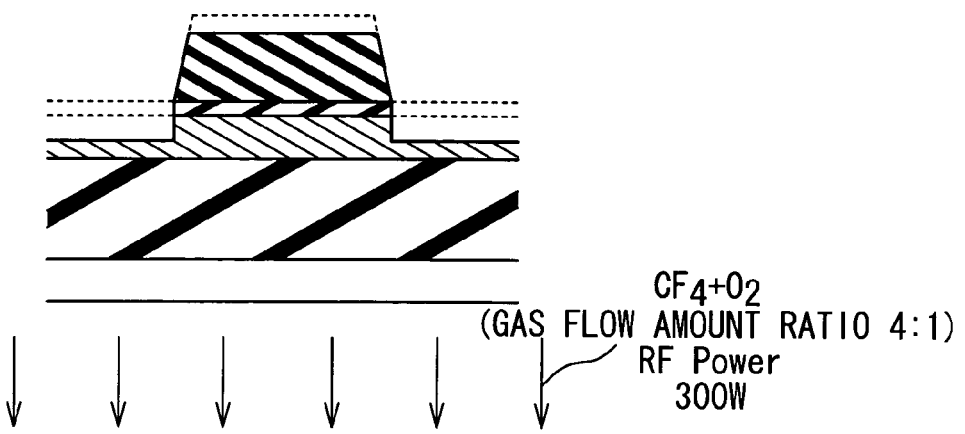
Figure 3C:
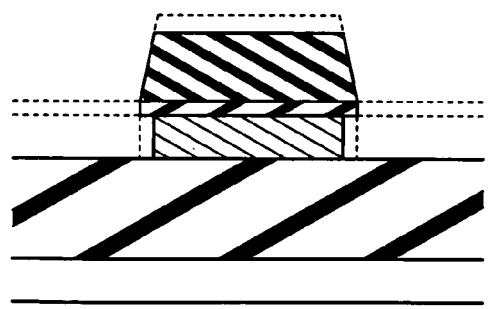

A first embodiment of a method for forming a pattern of a stacked film and a thin film transistor according to the present invention will be described below with reference to the attached drawings.

FIG. 4 is a cross-sectional view showing a configuration of a thin film transistor of the embodiments. The thin film transistor is provided on a glass substrate 101. The thin film transistor includes a lower oxide film 102, a polysilicon film 103, an upper oxide film 104, a gate oxide film 105, a micro-crystalline silicon (μc-Si) film 106, Cr film 107, a first interlayer oxide film 109, a second interlayer oxide film 112, contacts 113 and aluminum wirings 114.

The lower oxide film 102 is formed in a thickness of approximately 300 nm on the glass substrate 101. The polysilicon film 103 and the upper oxide film 104, which configure a two-layer structure, are provided in thicknesses of 60 nm and 10 nm, respectively, on the lower oxide film 102. Here, the polysilicon film 103 is firstly formed as an amorphous silicon film. Then, the amorphous silicon film is crystallized by an excimer laser to be the polysilicon film 103.

The polysilicon film 103 and the upper oxide film 104, which configure the two-layer structure, are simultaneously dry etched. By this type of simultaneous etching for the two-layer structure, the tapers of the upper oxide film 104 and polysilicon film 103 with respect to the plane of the glass substrate 101 are set in ranges of: $45°<\theta<60°$; and $10°<\gamma<60°$, respectively.

The polysilicon film 103 has a source region 110a, a drain region 110b, a channel region 130 and LDD regions 111a and 111b. High-concentration phosphorus ions are doped in the source region 110a and the drain region 110b. Low-concentration phosphorus ions are doped in the LDD regions 111a and 111b.

The gate oxide film 105 is formed to cover the two-layer structure and the lower oxide film 102. The gate oxide film 105 is, for example, a silicon dioxide film in a thickness of 45 nm. A two-layer film composed of the μc-Si film 106 and the Cr film 107 is formed as a gate electrode on the gate oxide film 105. For the gate electrode, the Cr film 107 is used as a high melting point metal that is excellent at resisting heat and low in electric resistance. In addition, the μc-Si film 106 is used as an interlayer material film between the gate oxide film 105 and the Cr film 107 in order to optimize a work function of the gate electrode and because of the ease with which it controls threshold values. For the high melting point metal utilized as the gate electrode material, W, Mo, Ti, Ta or a silicide film of any of these is used as well as Cr.

The first interlayer oxide film 109 is formed to cover the gate oxide film 105, the μc-Si film 106 and the Cr film 107. The first interlayer oxide film 109 is, for example, a silicon dioxide film in a thickness of 100 nm. The second interlayer oxide film 112 is formed on the first interlayer oxide film 109. The second interlayer oxide film 112 is, for example, a silicon dioxide film in a thickness of 300 nm. The contact 113 is a wiring formed in a hole extended through the second interlayer oxide film 112, the first interlayer oxide film 109, the gate oxide film 105 and the upper oxide film 104 to reach the source region 110a or the drain region 110b. The contact 113 is, for example, made of aluminum. The aluminum wiring 114 is a wiring connected to the contact 113.

A manufacturing method of a thin film transistor in FIG. 4 will be described with reference to the attached drawings. FIGS. 5A, 5B, 5C, 6A, 6B, 7A, 7B, 8A, 8B and 8C are views showing a flow of the manufacturing method of a thin film transistor. Here, FIGS. 5A, 5B, 5C, 6B, 7B, 8A, 8B and 8C are cross-sectional views. FIGS. 6A and 7A are plane views with respect to FIGS. 6B and 7B, respectively.

Figure 5A:
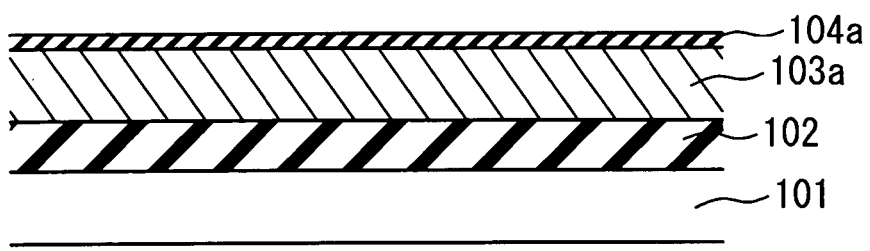
FIGS. 5A, 5B and 5C are views showing a flow of the manufacturing method of a thin film transistor of the embodiments.
Figure 6A:
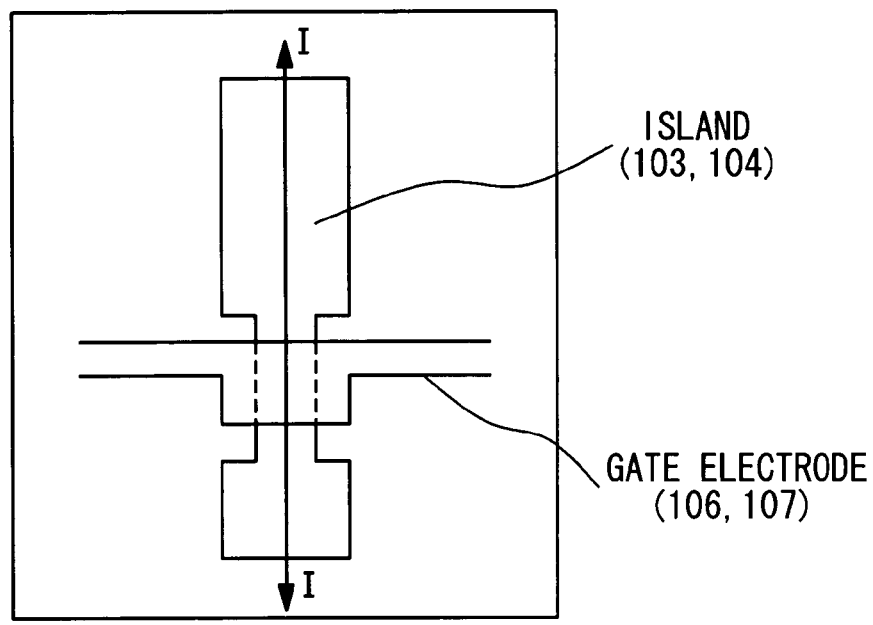
FIGS. 6A and 6B are views showing the flow of the manufacturing method of a thin film transistor of the embodiments.

With reference to FIG. 5A, the lower oxide film 102 is deposited in a thickness of approximately 300 nm on the glass substrate 101. A silicon film 103a and an upper oxide film 104a are deposited in thicknesses of 60 nm and 10 nm, respectively, on the lower oxide film 102.

Figure 5B:
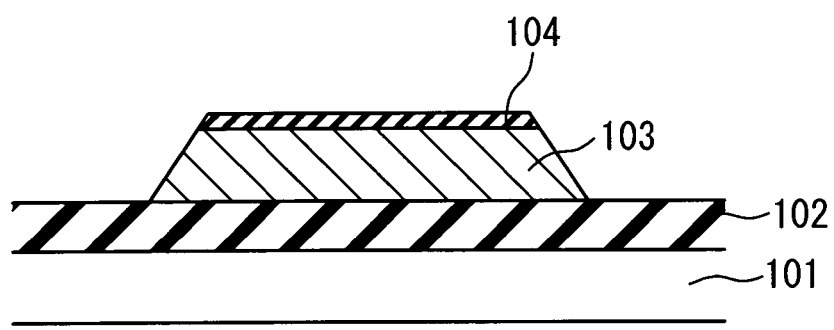

With reference to FIG. 5B, the silicon film 103a is crystallized by an excimer laser. The silicon film 103a has been crystallized by the excimer laser to be the polysilicon film. Next, the crystallized silicon film 103a and the upper oxide film 104a, which configure the two-layer structure, are simultaneously dry etched (ex. a reactive ion etching method) so as to obtain the polysilicon film 103 and the upper oxide film 104. The two-layer structure after the etching is also referred to as an island portion. By this type of simultaneous etching for the two-layer structure, the tapers of the upper oxide film 104 and polysilicon film 103 with respect to the plane of the glass substrate 101 are set in ranges of: $45°<\theta<60°$; and $10°<\gamma<60°$, respectively.

Figure 5C:
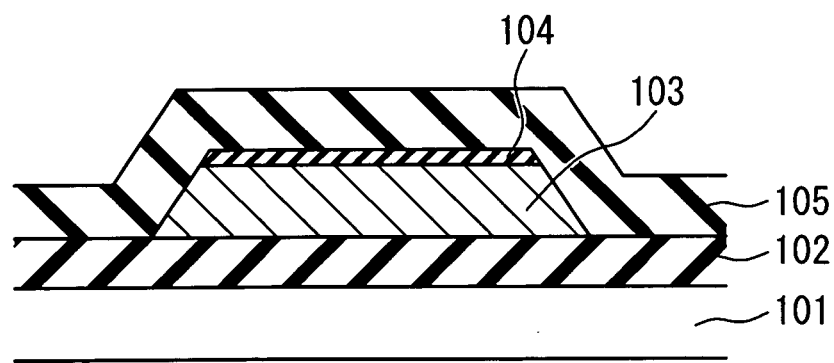

With reference to FIG. 5C, after forming the two-layer structure, high-concentration phosphorus ions are doped into the polysilicon film 103 to form the source region 110a and the drain region 110b. Also, low-concentration phosphorus ions are doped into the polysilicon film 103 to form the LDD regions 111a and 111b. Thereafter, the gate oxide film 105 is formed in a thickness of 45 nm to cover the two-layer structure. The source region 110a, the drain region 110b, the LDD regions 111a and 111b are not shown in FIG. 5C.

Figure 6B:
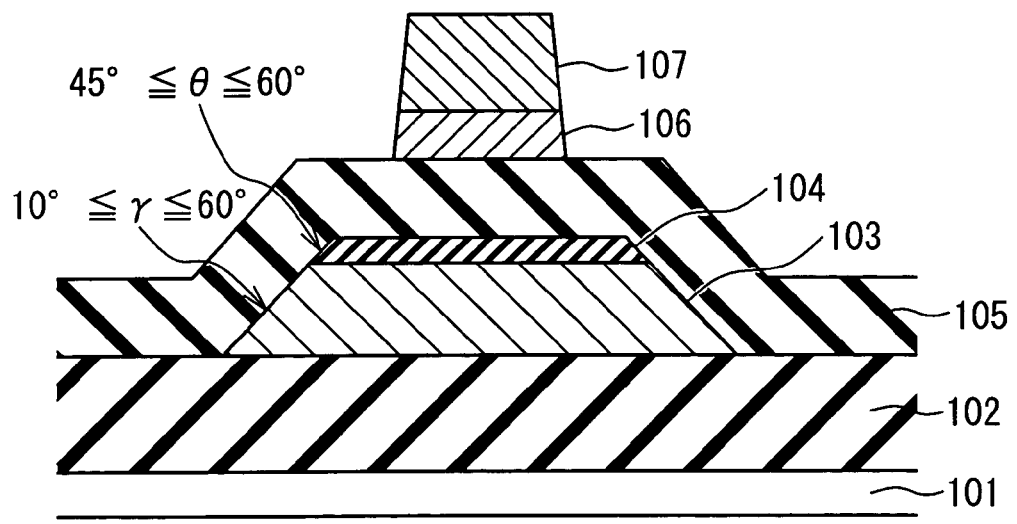
Figure 7A:
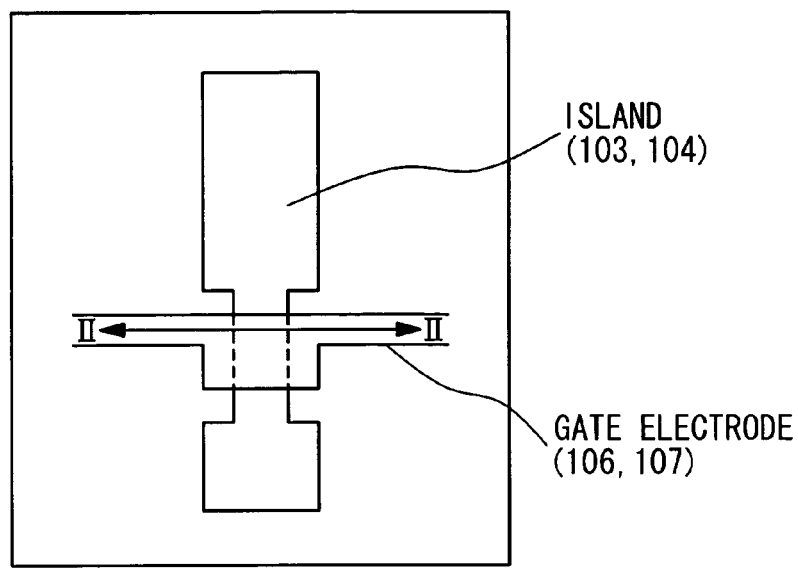
FIGS. 7A and 7B are views showing the flow of the manufacturing method of a thin film transistor of the embodiments.
Figure 7B:
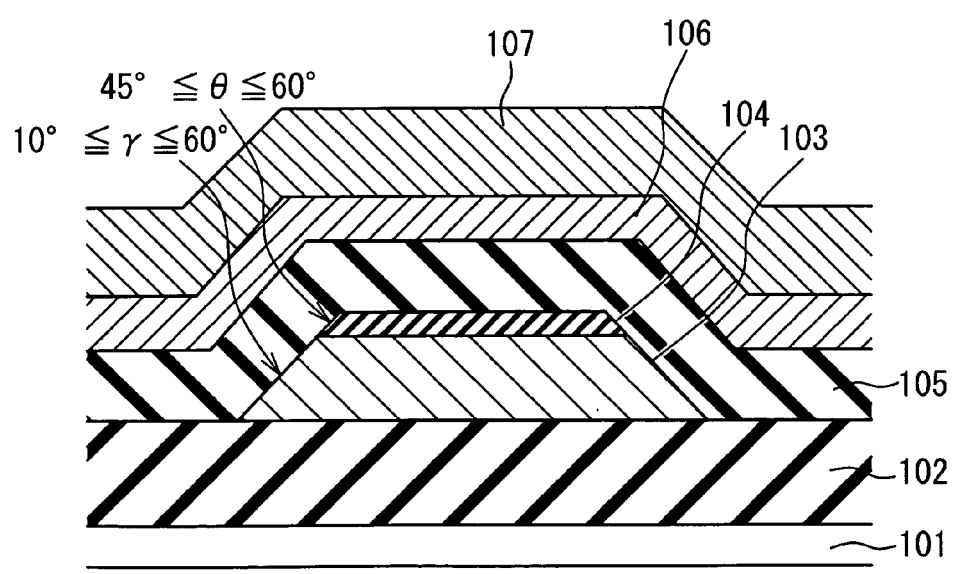

With reference to FIGS. 6A, 6B, 7A and 7B, a two-layer film composed of the micro-crystalline silicon film 106 and the Cr film 107 is deposited and etched, thus forming a gate electrode with a desirable pattern. FIG. 6A is the plane view and FIG. 6B is the cross-sectional view along the line I-I shown in FIG. 6A. FIG. 7A is the plane view and FIG. 7B is the cross-sectional view along the line II-II shown in FIG. 7A. In the two-layer structure of the island portion, the taper of the upper oxide film 104 with respect to the plane of the glass substrate 101 is set in range of $45<\theta<60°$ by the etching shown in FIG. 5B. The taper of the polysilicon film 103 with respect to the plane of the glass substrate 101 is set in ranges of $10°<\gamma<60°$ by the etching shown in FIG. 5B.

Thereafter, the first interlayer oxide film 109 is deposited on the gate oxide film 105 and the gate electrode (106, 107) in a thickness of 100 nm. After that, a heat treatment at a temperature equal to or more than 350° C. is carried out to activate impurities in the phosphorus-doped polysilicon film 103, thus lowering the electric resistance of the polysilicon film 103.

Following the steps described above, the second interlayer oxide film 112 is further deposited in a thickness of 300 nm on the first interlayer oxide film 109. Subsequently, the second interlayer oxide film 112, the first interlayer oxide film 109, the gate oxide film 105 and the upper oxide film 104 are opened to form the contact 113. Then, the aluminum wiring 114 is provided. The contact 113 is connected with the aluminum wiring 114. In this way, a desired thin film transistor is manufactured as shown in FIG. 4.

Next, a method for setting the tapers of the upper oxide film and polysilicon film of the two-layer structure applied to the manufacturing method of the thin film transistor will be described with reference to attached drawings. This method can etch the upper oxide film and polysilicon film in the ranges of: $45°<\theta<60°$; and $10°<\gamma<60°$, respectively, with respect to the plane (surface) of the glass substrate.

Figure 8A:
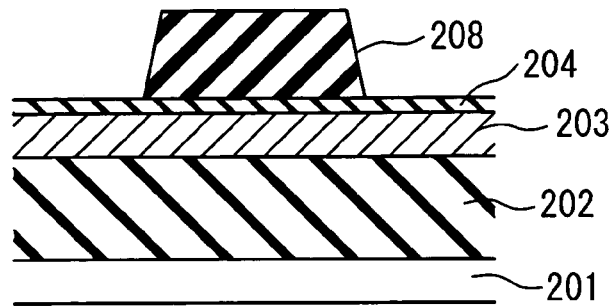
FIGS. 8A, 8B and 8C are cross-sectional views showing the method for setting the tapers of the upper oxide film and polysilicon film of the embodiments.
Figure 8B:
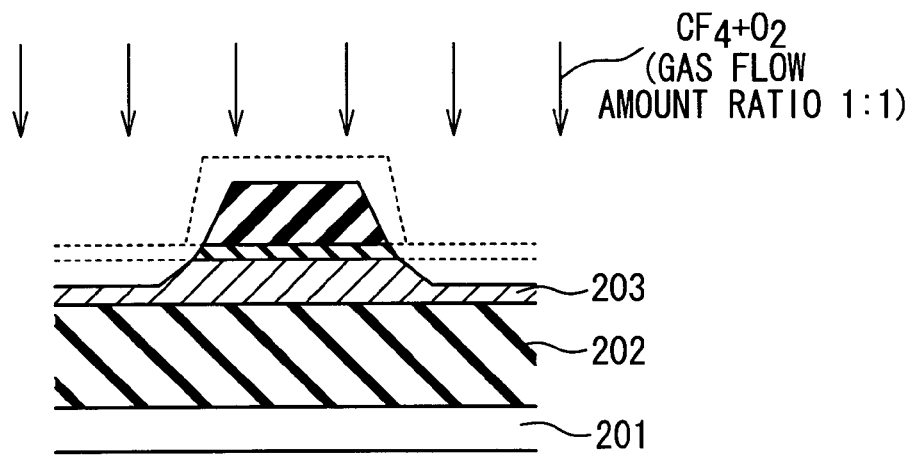
Figure 8C:
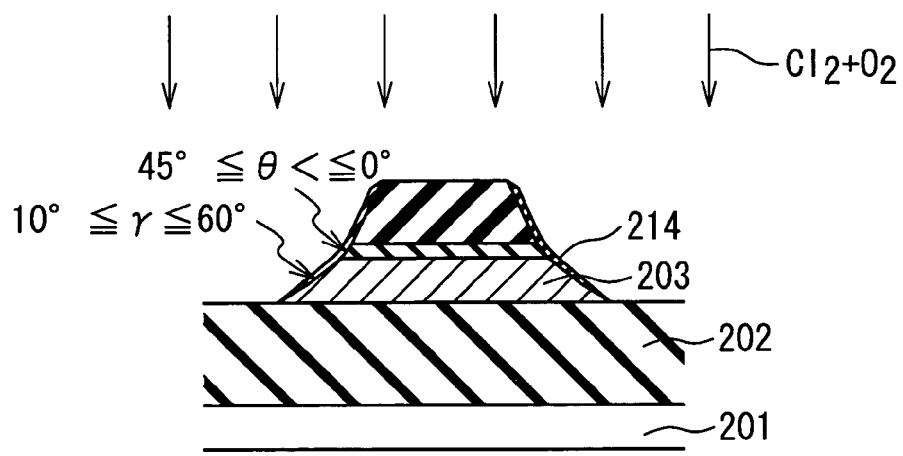

FIGS. 8A, 8B and 8C are cross-sectional views showing the method for setting the tapers of the upper oxide film and polysilicon film. The processes of FIGS. 8A, 8B and 8C are included in the process of in FIG. 5B.

Firstly, with reference to FIG. 8A, the pattern of the photoresist 208 is formed on the upper oxide film 204.

Subsequently, with reference to FIG. 8B, reactive ion etching is conducted on the upper oxide film 204 and the polysilicon film 203 by a gas containing $CF_4$ and $O_2$, using the photoresist 208 as an etching mask. The gas flow amount ratio of $CF_4$ and $O_2$ during this etching is set at 1:1, thus tapering the side face of the two-layer structure of the upper oxide film 204 and polysilicon film 203 in the range of $45°<\theta_0<60°$. Note that, beside the gas containing $CF_4$ and $O_2$, a gas containing a fluorine-based gas such as $CHF_3$ and $SF_6$, and $O_2$ may be used.

Next, with reference to FIG. 8C, the etching gas is switched to a gas containing $Cl_2$ and $O_2$ at the time when the polysilicon film 203 is etched and the lower oxide film 202 is exposed. The etching rate of the gas containing $Cl_2$ and $O_2$ for a polysilicon film is higher than that for an oxide film. Therefore, it can be possible to restrict the etching of the lower oxide film 202 to the minimum. In addition, by setting the gas flow amount ratio of $Cl_2$ and $O_2$ at 1:1, the side face of the polysilicon film 203 can be further slanted. In this case, the deposition reaction product 214 is created on the sidewall of the resist 208 and the sidewall of the two-layer structure of the upper oxide film 204 and the polysilicon film 203. Therefore, the side etching of the polysilicon film 203 is prevented. Hence, the taper of the two-layer structure of the upper oxide film 204 and the polysilicon film 203, which is formed by use of the gas containing the $CF_4$ and $O_2$ in the gas flow amount ratio of 1:1, can be maintained. Simultaneously, the polysilicon film 203 remaining on the lower oxide film 202 due to etching variations is removed by the gas containing $Cl_2$ and $O_2$. Particularly, the taper angle of the polysilicon film 203 on the interface with the lower oxide film 202 ranges as: $10°<\gamma<60°$ due to the etching variations in the glass substrate.

As described above, if the method for manufacturing a thin film transistor according to the first embodiment of the present invention is used, the taper angle of the side face of the two-layer structure can be reduced to 45°. Hence, with reference to FIG. 7B, the three-layer film composed of the gate oxide film 105, the μc-Si film 106 and the Cr film 107 can be thickened on the sidewall step portion of the two-layer structure. Hence, the concentration of the stress on the oxide film 105 and the gate electrode (μc-Si film 106 and Cr film 107) in the sidewall portion of the two-layer structure is absorbed, and thus the disconnection of the gate electrode does not occur even if the thin film transistor is subjected to a heat treatment in a later step.

Next, a method for controlling the taper angles of the upper oxide film and the polysilicon film using simultaneous etching in the method for manufacturing a thin film transistor device in accordance with the first embodiment of the present invention will be described below.

Figure 9:
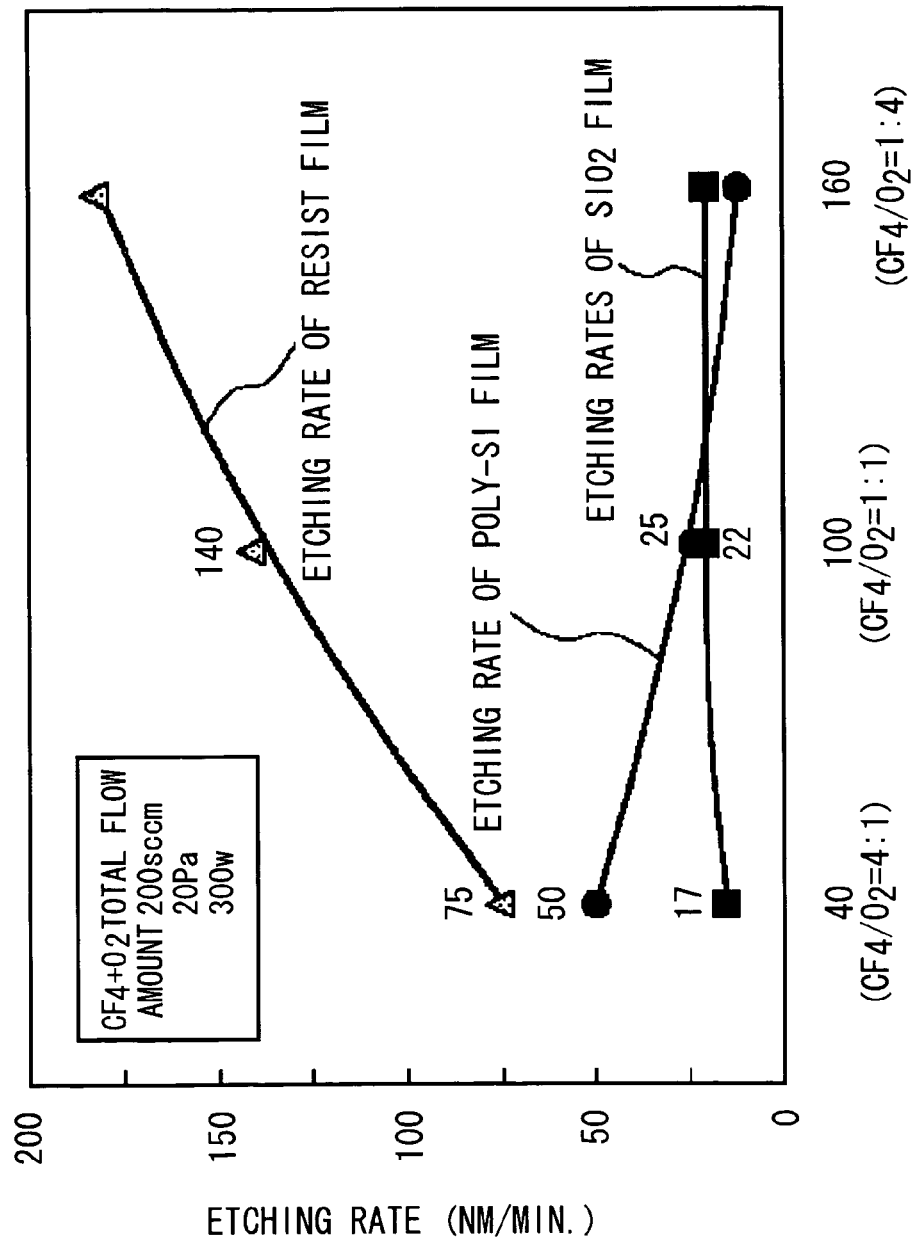
FIG. 9 is a graph showing a relation between the etching rates of films and the $O_2$ flow amounts in the reactive ion etching by the gas containing $CF_4$ and $O_2$ of the embodiments.

FIG. 9 is a graph showing a relation between the etching rates of films and the $O_2$ flow amounts in the reactive ion etching by the gas containing $CF_4$ and $O_2$. The vertical axis indicates the etching rate. The horizontal axis indicates the gas flow amount (ratio) of $O_2$. The triangles indicate etching rates of the resist films. The circles indicate etching rates of the polysilicon films. The squares indicate etching rates of the oxide films. The etching conditions are: total gas flow amount 200 sccm; gas pressure 20 Pa; and RF power 300 W.

When the gas flow amount ratio of $CF_4$ and $O_2$ of the etching gas is 4:1, the etching rate of the oxide film is approximately 17 nm/min., and the etching rate of the polysilicon film is approximately 50 nm/min. The etching rate of the polysilicon film is approximately three times that of the oxide film. For this, when the gas flow amount (ratio) of $O_2$ is increased, the etching rate of the oxide film is slightly increased while the etching rate of the polysilicon film is decreased. Specifically, when the gas flow amount ratio of $CF_4:O_2$ is 1:1, the etching rate of the oxide film becomes approximately 22 nm/min. The etching rate of the polysilicon film becomes approximately 25 nm/min. Both of which become approximately equal with each other. As a result of this etching operation, the upper oxide film stops protruding with respect to the polysilicon film, and the side face of the two-layer structure becomes smooth along the interface between the upper oxide film and the polysilicon film.

When the gas flow amount ratio of $CF_4$ and $O_2$ is 4:1, the etching rate of the resist is 75 nm/min. When the gas flow amount (ratio) of $O_2$ is increased, the etching rate of the resist is increased. When the gas flow amount ratio of $CF_4$ and $O_2$ is 1:1, the etching rate of the resist becomes 140 nm/min, which is approximately twice that in the case of the gas flow amount ratio of 4:1. Thus, the etching of the side face of the resist advances because the etching rate of the resist is increased as compared with those of the oxide film and polysilicon film. Thus, the etched surface of the resist is set back with respect to the other etched films. The reason that the etching rate of the resist is increased following the increase of the gas flow amount (ratio) of the $O_2$ is as follows.

Specifically, the composition of the resist is a chemical composition of phenol novolak resin in which $CH_2$, $CH_3$ and OH groups are bonded to a benzene ring. In this composition, oxygen radicals in $O_2$ plasma attack the $CH_2$ and $CH_3$ groups to dissociate bonds thereof. Thus, the etching rate of the resist film is increased. By the etching operation described above, the oxide film and the polysilicon film are uniformly etched while the resist film is being set back in the lateral direction. In such a way, the side face of the two-layer structure of the upper oxide film and the polysilicon film can be formed into the gentle taper shape in which the taper angle ranges as: $45°<\theta<60°$ with respect to the plane of the glass substrate.

Although the example of using the gas containing $CF_4$ and $O_2$ has been described in this embodiment, a fluorine-based gas such as $CHF_3$ and $SF_6$ may be used in place of $CF_4$. Also in this case, when the gas flow amount (ratio) of $O_2$ is increased in a similar way to that of this embodiment, the etching rate of the polysilicon film is decreased, the etching rate of the oxide film is increased.

However, the relationship between the gas flow amount (ratio) of the $O_2$ content and the taper angle of the side face of the two-layer structure differs depending on the type of the fluorine-based gases.

Next, the etching operation in the event of switching the etching gas from the gas containing $CF_4$ and $O_2$ to the gas containing $Cl_2$ and $O_2$ will be described. The etching conditions are:

Total gas flow amount: 400 sccm;
Gas flow amount ratio: $Cl_2:O_2=1:1$;
Gas pressure: 40 Pa; and
RF power: 400 W In the etching by the gas containing $Cl_2$ and $O_2$, the etching rate of the polysilicon film to the oxide film is as large as approximately 10. Therefore, the etching of the lower oxide film can be restricted to the minimum. In addition, in the etching by the gas containing $Cl_2$ and $O_2$ in the gas flow amount ratio of 1:1, the resist on the polysilicon film is set back in a similar way to that of the etching by the gas containing $CF_4$ and $O_2$ in the gas flow amount ratio of 1:1. The side face of the polysilicon film is tapered with a low angle. Simultaneously, SiClxOy that is the reaction product of the etching is deposited. Therefore, facilitating the formation of the sidewall of the reaction product on the two-layer structure. Hence, the side face of the polysilicon film is tapered, and the side etching of the two-layer structure is prevented. Moreover, the etching amount of the lower oxide film can be restricted to the minimum while maintaining the taper added to the side face of the two-layer structure.

Timing when the polysilicon film is etched and the lower oxide film is exposed in the foregoing operation will be described below. The polysilicon film is etched fast in an outer region of the glass substrate because the etching advances fast there. Hence, at the time when the lower oxide film in this region is exposed, the etching of the polysilicon film is not yet completed in an inner region of the glass substrate, where the etching advances slowly. Even if the etching gas is switched to the gas containing $Cl_2$ and $O_2$ at that time, the resist is continuously set back in a similar way to the previous etching by the gas containing $CF_4$ and $O_2$ in the inner region. Simultaneously, the etching product is deposited on the side face of the two-layer structure of the already etched upper oxide film and the polysilicon film. Specifically, in the region where the etching of the polysilicon film advances in the film-thickness direction, etching by the accelerated ion components of the etching gas is conducted. In addition, the etching product is deposited on the etched side face of the polysilicon film in the region where the polysilicon film is already etched in the film-thickness direction, and the side etching by the radical components of the etching gas is prevented. Moreover, in the etching by the gas containing $Cl_2$ and $O_2$, it is considered that the taper angle, which is set in the range of $45°<\theta<60°$ on the side face of the polysilicon film formed under the previous etching conditions by $CF_4$ and $O_2$, is further reduced by the etching product deposited on the side face of the polysilicon film. The reason is as follows. In the etching by the gas containing $Cl_2$ and $O_2$, the etching product is uniformly deposited on almost the entire surface, and simultaneously, the deposition on the surface to be etched is etched by the incidence of the reactive ions. Then, when the object to be etched is exposed, the etching advances. However, the vertically incident ions cannot remove the deposition entirely because the resist and the etching product of the sidewall portion of the two-layer structure are thick, and the etching product remains on the sidewall. Hence, the width of the two-layer structure is expanded as the etching advances in the film thickness direction due to the existence of the etching product. In such a way, the etching product is deposited on the side face of the polysilicon film, and the width of the two-layer structure is expanded from the bottom as the etching advances, thus forming the taper.

As described above, it is considered that, in the side face of the two-layer structure tapered in the angle ranging as: $45°<\theta<60°$, the taper angle is further reduced by use of the gas in which the gas flow amount ratio of $Cl_2$ and $O_2$ is 1:1. Hence, in the outer region of the substrate, where the etching advances fast, the taper in the range of: $45°<\theta<60°$, which is formed under the previous etching conditions of $CF_4$ and $O_2$, is maintained by the deposition of the etching product on the sidewall. In the inner region of the substrate, where the etching advances slowly, the polysilicon film on the interface portion between the polysilicon film and the lower oxide film, that is, the polysilicon film etched by the gas containing $Cl_2$ and $O_2$, reduces its taper angle more than the taper angle in the range of: $45°<\theta<60°$, which is formed by the previous etching by the gas containing $CF_4$ and $O_2$. The taper angle of the polysilicon film in the concerned portion is reduced to approximately 10°. Hence, the taper angle of the polysilicon film becomes an angle ranging as $10°<\gamma<60°$ in the entire substrate due to the distributions as to how the etching advances in the glass substrate.

Next, as to how the pattern precision of the two-layer structure of the upper oxide film and the polysilicon film is changed in the case of tapering the same by the reactive ion etching will be described below.

The etching rate for the resist under the reactive ion etching conditions in which the gas flow amount ratio of $CF_4$ and $O_2$ is 1:1 indicates the etching rate of the etching in the vertical direction. It is assumed that the etching rate in the lateral direction is approximately two thirds that in the vertical direction, and that the two-layer structure is entirely etched under the etching conditions where the gas flow amount ratio of $CF_4$ and $O_2$ is 1:1. The setback amount of the resist in the lateral direction in this case is estimated to be approximately 0.27 μm based on the calculation of the etching rates for the respective films. Hence, the deviation, from a design value, of the value in the case of vertically etching the two-layer structure is 0.27 μm.

Next, assuming that the taper angle of the side face of the two-layer structure when etching the two-layer structure is 60°, then the deviation of the value in this case from the design value is estimated to be approximately 0.23 μm.

Hence, the two-layer structure is formed into the taper shape of 60° or less by the reactive ion etching, thus making it possible to control the deviation from the design value within 0.23 μm.

Although the gas flow amount ratio of $CF_4$ and $O_2$ in the present invention is set at 1:1, the taper angle of the two-layer structure can be further reduced if the gas flow amount (ratio) of $O_2$ is further increased. However in this case, the etching rate for the polysilicon is reduced to greatly increase the etching time. Thus, the dimensional precision of the two-layer structure is deteriorated. Hence, 1:1 is thought to be reasonable for the gas flow amount ratio of $CF_4$ and $O_2$.

With regard to the film thicknesses of the films of the two-layer structure, it is desirable to set the thickness of the upper oxide film equal to 10 nm and the thickness of the polysilicon film equal to 60 nm. This is because the variations due to the etching are increased in the case of etching the upper oxide film and the polysilicon film when thickening the upper oxide film more than 10 nm and the polysilicon film more than 60 nm. The two-layer structure formed in this state is deteriorated in dimensional precision, leading to the deterioration of the OFF characteristics of the TFT.

As mentioned above, in accordance with the contents of the present invention, in the two-layer film of the two-layer structure portion, the taper angle of the upper oxide film of the island portion is controlled in the range of: $45°<\theta<60°$, and the taper angle of the polysilicon layer thereof is controlled in the range of $10°<\gamma<60°$. Thus, the step coverage for the gate oxide film and the Cr/μc-Si stacked film after the formation of the two-layer structure is enhanced. Moreover, the disconnection of the gate electrode can be prevented in a portion where the gate electrode crosses over the two-layer structure. In addition, the lower oxide film of the two-layer structure is made not to be etched as much as possible, thus reducing the excessive etching and side etching of the lower oxide film of the two-layer structure. Thus, the coverage defect of the gate oxide film and the disconnection of the gate electrode can be prevented.

Meanwhile, the two-layer structure of the lower oxide film/polysilicon film in the present invention is tapered, thus making it possible to prevent the occurrence of the crack in the gate electrode which crosses over the two-layer structure.

Second Embodiment

Next, a second embodiment of the method for forming a pattern of a stacked film of the present invention will be described. In the second embodiment, the etching time for the reactive ion etching by the gas containing $CF_4$ and $O_2$ when forming the two-layer structure is shortened.

Figure 10:
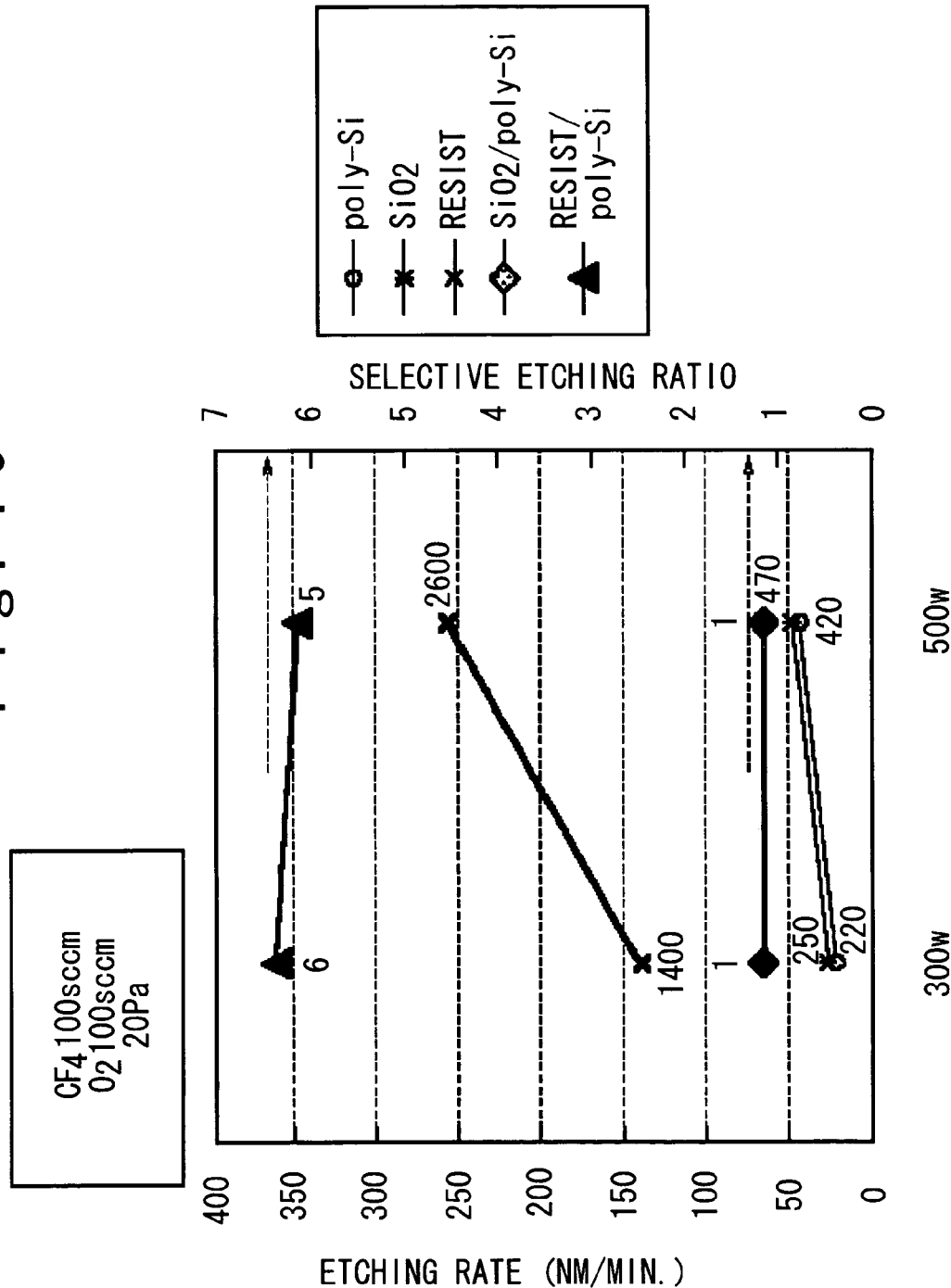
FIG. 10 is a graph showing RF power dependencies of etching rates of etching gases of the second embodiment.

FIG. 10 is a graph showing RF power dependencies of etching rates, for respective films, of etching gases for use in the second embodiment. Similarly to the first embodiment, the upper oxide film and the polysilicon film undergo the reactive ion etching by the gas series of $CF_4$ and $O_2$ by use of the photoresist as an etching mask until the lower oxide film is exposed. In this case, in the second embodiment, the etching conditions are set as:

Gas flow amount ratio of $CF_4$ and $O_2$:1:1;
Total gas flow amount: 200 sccm;
Gas pressure: 20 Pa; and
RF power: 300 W and 500 W When the RF power is increased from 300 W to 500 W, though the etching rate for the polysilicon film is approximately doubled (40 nm/min), its selective etching ratio comparing with the lower oxide film is hardly changed (=approximately 1), and its selective etching ratio comparing with the photoresist is hardly changed (=approximately 6), either. Therefore, the etching time can be shortened while maintaining the taper angle of the upper oxide film of the two-layer structure in the range of: $45°<\theta<60°$ and the taper angle of the polysilicon layer thereof in the rage of:$10°<\gamma<60°$, thus making it possible to enhance the processing capability of the apparatus. Moreover, when the etching rate is increased, a ratio of a change in intensity of plasma emission for use in detecting the end point of the etching is increased, and therefore, a definite detection for the end point can be performed.

From the point of time when the lower oxide film is exposed, the etching gas is switched to the gas containing $Cl_2$ and $O_2$. Thus, the etching amount of the lower oxide film can be minimized, and the side etching of the polysilicon film can also be restricted. Accordingly, the taper of the two-layer structure processed by the gas series of $CF_4$ and $O_2$ can be maintained. Hence, the step coverage of the gate insulating film and gate electrode, which cross over the two-layer structure after the formation thereof is enhanced, thus making it possible to prevent the gate electrode from being disconnected.

As described above, according to the method for forming a pattern of a stacked film, the first oxide film, the semiconductor film and the second oxide film are sequentially deposited on the substrate, and the semiconductor film is laser annealed. Thereafter, the resist pattern is formed on the second oxide film, and by use of the resist pattern as a mask, the second oxide film and the semiconductor film are dry etched to form the pattern of the stacked film (two-layer structure) composed of the semiconductor film and the second oxide film. At this time, the fluorine-based gas is used as the dry etching gas for the second oxide film and the semiconductor film, and the etching gas is switched from the fluorine-based gas to the chlorine-based gas at the point of time when the first oxide film is exposed. The mixed gas of $CF_4$ and $O_2$ is used as the fluorine-based gas, and suitably, the gas flow amount ratio of $CF_4$ and $O_2$ in the mixed gas is set at 1:1, thus conducting the dry etching therefor. In such a way, the taper angle of the second oxide film of the pattern of the stacked film can be made larger than the taper angle of the semiconductor film thereof. Specifically, the taper angles of the second oxide film and semiconductor film can be controlled into the ranges of: $45°<\theta<60°$ and $10°<\gamma<60°$, respectively. Hence, the step disconnection of the wiring that crosses over this pattern of the stacked film can be prevented.

Third Embodiment

The third embodiment in the method for forming the pattern of the stacked film and the thin film transistor of the present invention will be described below.

Figure 11:
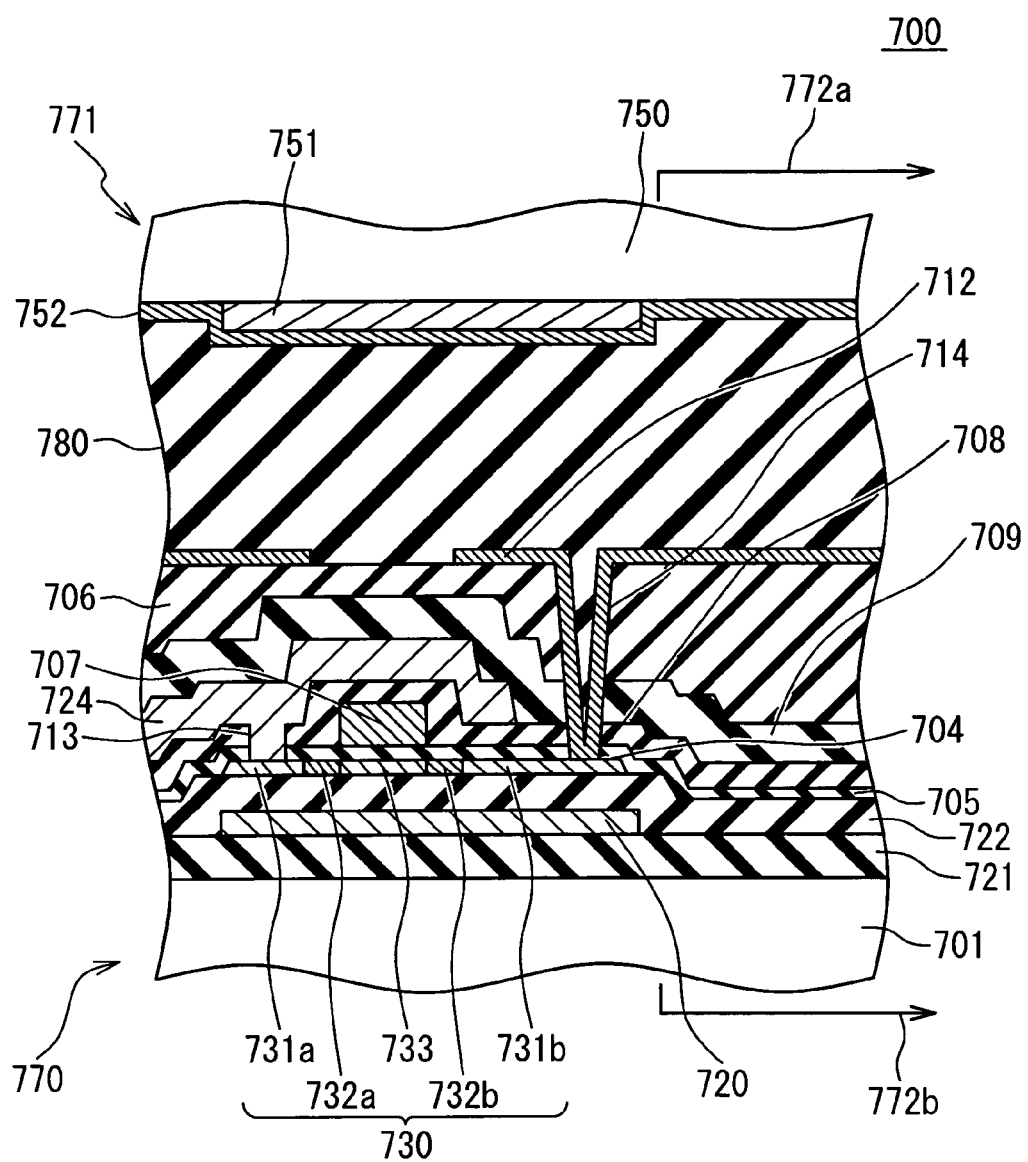
FIG. 11 is a cross-sectional view showing the configuration of a liquid crystal light valve to which the third embodiment of the method for forming the pattern of the stacked film in the present invention and the thin film transistor are applied.

At first, the configuration of the third embodiment of the method for forming the pattern of the stacked film and the thin film transistor in the present invention is explained. FIG. 11 is a cross-sectional view showing the configuration of a liquid crystal light valve to which the third embodiment of the present invention are applied. The liquid crystal light valve 700 includes a TFT array substrate 770, an opposite substrate 771 and a liquid crystal 780.

The TFT array substrate 770 has a plurality of thin film transistors arrayed like a matrix and a plurality of pixel electrodes that are turned on and off by the thin film transistors. The opposite substrate 771 has the common opposite electrode opposite to the plurality of pixel electrodes of the TFT array substrate 770. The liquid crystal 780 is put and held between the TFT array substrate 770 and the opposite substrate 771. Here, as FIG. 11 is the cross-sectional view to explain the concept of the light shielding of the liquid crystal light valve 700, a part of configuration is omitted. The relations among the films, such as a dimensional relation of film thickness, are different from the actual relations.

In the above-mentioned first and second embodiments, the present invention is applied to the thin film transistor formed on the insulating film on the glass substrate. However, in this embodiment, the liquid crystal light valve 700 further having a conductive layer in the lower layer of the thin film transistor is explained as an example. Here, the conductive layer is formed in the lower layer of the thin film transistor, in order to satisfy the property necessary for the thin film transistor, depending on the device to which the thin film transistor is applied.

The TFT array substrate 770 is composed of a transparent substrate 701, a first base insulating film 721, a light shielding film 720, a second base insulating film 722, a polysilicon film 730, a silicon oxide film 704, a gate insulating film 705, a gate line 707, a first interlayer insulating film 708, a data line 724, a second interlayer insulating film 709, a flattening film 706, and a pixel electrode 712.

The transparent substrate 701 is made of the material that has the insulating property such as glass and transmits the light.

The first base insulating film 721 is formed so as to cover the surface of the transparent substrate 701. The first base insulating film 721 is formed by using the method such as the CVD (Chemical Vapor Deposition) method. The first base insulating film 721 protects the diffusion of the heavy metal included in the transparent substrate 701. Here, The first base insulating film 721 is the silicon oxide film having a film thickness of 300 nm.

The light shielding film 720 is formed correspondingly to the position where the thin film transistor on the first base insulating film 721 is formed. The light shielding film 720 is conductive, and formed by patterning the film formed by the method such as the sputtering method. The light shielding film 720 enables the property of the thin film transistor to be improved. Here, the light shielding film 720 is the tungsten silicide film having a film thickness of 175 mm. The light shielding film 720 may have the two-layer structure composed of the tungsten silicide film and an amorphous silicon film stacked thereon. The light shielding film 720 may have the three-layer structure composed of the tungsten silicide film and the amorphous silicon film stacked through the silicon oxide film thereon. The configuration of the light shielding film 720 is selected from above-mentioned structure, based on the required performance.

The second base insulating film 722 is formed so as to cover the first base insulating film 721 and the light shielding film 720. The second base insulating film 722 is formed by using the method such as the CVD method. The second base insulating film 722 insulates the light shielding film 720 from the thin film transistor. Here, the second base insulating film 722 is the silicon oxide film having a film thickness of 250 nm. However, the film thickness of the second base insulating film 722 defines the distance between the light shielding film 720 and the polysilicon film 730 of the thin film transistor. For this reason, it is important to determine the film thickness of the second base insulating film 722 to obtain the desirable light shielding property. Thus, the film thickness of the second base insulating film 722 is preferably selected in the range between 100 nm and 500 nm, depending on the desired performance of the thin film transistor. Further preferably, the film thickness is selected in the range between 150 nm and 300 nm.

The polysilicon film 730 is formed correspondingly to the position where the light shielding film 720 on the second base insulating film 722 is formed. The polysilicon film 730 is formed such that the amorphous silicon film is crystallized by using the method such as the laser annealing method and then patterning it. Here, the amorphous silicon film is formed by the method such as an LPCVD (Low Pressure CVD) method or a PCVD (Plasma Enhanced CVD) method. The polysilicon film 730 functions as the active layer of the thin film transistor. Here, the polysilicon film 730 has the film thickness of 60 nm.

The polysilicon film 730 includes a source region 731*a*, a drain region 731*b*, LDD (Lightly Doped Drain) regions 732*a*, 732*b*, and a channel region 733. In the source region 731*a* and the drain region 731*b*, impurities are doped at high concentrations. In the LDD regions 732*a*, 732*b*, impurities are doped at low concentrations. In the channel region 733, impurities are not doped.

The silicon oxide film 704 is insulative and formed on the polysilicon film 730. The silicon oxide film 704 is formed after the amorphous silicon film, by using the method such as the CVD method. After the amorphous silicon film is crystallized, the silicon oxide film 704 is patterned together with the polysilicon film. The silicon oxide film 704 protects the surface of the polysilicon film 730. Here, the silicon oxide film 704 has the film thickness of 10 nm.

Here, due to the patterning of the polysilicon film 730 and the silicon oxide film 704, the taper angles of the sectional shape of the end of the polysilicon film 730 and the silicon oxide film 704 are in the range from 40° to 60°. FIG. 11 shows only one cross section. However, the taper angles are formed on the entire periphery of the polysilicon film 730 and the silicon oxide film 704.

The gate insulating film 705 is formed so as to cover the second base insulating film 722, the polysilicon film 730 and the silicon oxide film 704. The gate insulating film 705 is formed by using the method such as the CVD method. The gate insulating film 705 is the gate insulating film of the thin film transistor. Here, the gate insulating film 705 is the silicon oxide film having a film thickness of 90 nm.

Here, the laser annealing is performed on the stacked film of the amorphous silicon film and the silicon oxide film (704), and the silicon oxide film 704 is used in its original state as a part of the gate insulating film. However, it may be possible to directly perform the laser annealing on the amorphous silicon film and form the gate insulating film 705 without forming the silicon oxide film 704. In this case, it is possible to delete the step of forming the silicon oxide film 704. It may be also possible to perform the laser annealing on the stacked film of the amorphous silicon film and the silicon oxide film (704) and once removing the silicon oxide film 704 by a wet etching and then form the gate insulating film 705. In this case, the usage of the silicon oxide film 704 affected by the laser annealing is unnecessary. In any case, the film thickness of the gate insulating film 705 is assumed to be 100 nm.

The gate line 707 is formed correspondingly to the channel region 733 so as to cross over the polysilicon film 730 on the gate insulating film 705. The gate line 707 is conductive, and is formed by patterning the conductive film formed by the method such as the CVD method and the sputtering method. The gate line 707 supplies a signal for turning on and off (selecting) the thin film transistor. Here, the gate line 707 has the two-layer structure having the polysilicon film and the tungsten silicide film. The polysilicon film has a film thickness of 100 nm where impurities are doped. The tungsten silicide film has a film thickness of 150 nm stacked on the polysilicon film.

The first interlayer insulating film 708 is formed so as to cover the gate insulating film 705 and the gate line 707. The first interlayer insulating film 708 is formed by the method such as the CVD method. The first interlayer insulating film 708 insulates the gate line 707 from the data line 724. Here, the first interlayer insulating film 708 is the silicon oxide film having a film thickness of 400 nm.

The data line 724 is conductive and formed so as to be electrically connected to the source region 731*a* of the polysilicon film 730, on the first interlayer insulating film 708. The data line 724 is formed by using, for example, a following method. Firstly, the first interlayer insulating film 708, the gate insulating film 705 and the silicon oxide film 704 above the source region 731*a* are selectively removed so as to form a contact hole 713. Then, the conductive film is formed by the method such as the sputtering method so as to embed the contact hole 713 and cover the first interlayer insulating film 708. After that, the conductive film is patterned to be the data line 724. Through the data line 724, a data signal is sent to the thin film transistor. Here, the data line 724 is the aluminum film having a film thickness of 400 nm.

The second interlayer insulating film 709 is formed so as to cover the first interlayer insulating film 708 and the data line 724. For example, it is formed by the method such as the CVD method. The second interlayer insulating film 709 insulates the data line 724 from the pixel electrode 712. Here, the second interlayer insulating film 709 is the silicon oxide film having a film thickness of 400 nm.

The flattening film 706 is insulative and formed so as to cover the second interlayer insulating film 709. For example, the flattening film 706 is formed by coating an organic coating film by using the spin coating method and heating and curing. The concave and convex portions on the surface of the second interlayer insulating film 709 are made smooth. Here, the flattening film 706 is the organic film.

The pixel electrode 712 is conductive and formed on the flattening film 706 so as to be electrically connected to the drain region 731*b* of the polysilicon film 730. The pixel electrode 712 is formed by using, for example, a following method. Firstly, the silicon oxide film 704, the gate insulating film 705, the first interlayer insulating film 708, the second interlayer insulating film 709 and the flattening film 706 above the drain region 731*b* are selectively removed so as to form a contact hole 714. Then, the conductive film is formed by the method such as the sputtering method so as to cover the side of the contact hole 714 and the flattening film 706. After that, the conductive film is patterned to be the pixel electrode 712. When the thin film transistor is turned on, through the thin film transistor, the data signal is sent to the pixel electrode 712. Here, the pixel electrode 712 is an ITO (Indium Tin Oxide) film having a film thickness of 100 nm.

Here, the flattening film 706 made of the organic coating film is formed on the second interlayer insulating film 709, and the concave and convex portions are made smooth. Then, the ITO film is formed which becomes the pixel electrode 712. However, the flattening method is not limited thereto. CMP (Chemical Mechanical Polishing) method may be used. In this case, the precision in flatness is improved. Also, without any utilization of the flattening method, the ITO film may be formed directly on the second interlayer insulating film 709. In this case, the step of forming the flattening film 706 can be eliminated. The respective methods may be selected on the basis of the desired property.

Also, a black matrix may be made of light shielding film, on the second interlayer insulating film 709. In this case, the upper structure (the ITO film and the like) may be further formed on the interlayer insulating film. The combination with the flattening method is also possible.

The opposite substrate 771 has a transparent substrate 750, a black matrix 751 and an opposite electrode 752.

The transparent substrate 750 is made of the material that has the insulating property such as glass and transmits the light.

The black matrix 751 is formed in the shape of a square, on the transparent substrate 750. The black matrix 751 is the film having the light shielding property. The black matrix 751 is formed by the method such as the sputtering method.

The opposite electrode 752 is generated common to all pixels of the TFT array substrate 770, at the position opposite to the pixel electrode 712. The opposite electrode 752 is conductive and is kept at a constant potential. The opposite electrode 752 is generated by patterning the film formed by the method such as the sputtering method.

The liquid crystal 780 is put and held between the TFT array substrate 770 and the opposite substrate 771. Correspondingly to the values of the voltages applied to the pixel electrode 712 and the opposite electrode 752, the arrangement of molecules is changed, and the gradation is controlled on the basis of its degree.

The method for manufacturing the liquid crystal light valve 700 in FIG. 11 will be described below. FIGS. 11 to 13C are cross-sectional views showing the method for manufacturing the liquid crystal light valve 700. To the liquid crystal light valve 700, the third embodiment of the present invention are applied. The manufacturing method as described here is one example of the embodiment of the present invention, and the dimensions of the film thicknesses, the structure, the procedure and the like except those with regard to the basic property of the present invention do not limit the present invention.

Figure 12A:
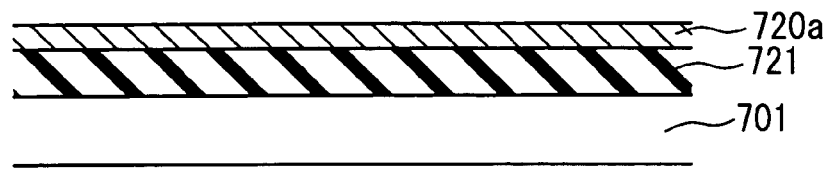
FIGS. 12A to 12D are cross-sectional views showing the method for manufacturing the liquid crystal light valve of the third embodiment.

At first, with reference to FIG. 12A, the silicon oxide film having a thickness of 300 nm as the first base insulating film 721 is deposited so as to cover the entire surface of the transparent substrate 701 by using the typical CVD method. Next, the tungsten silicide film 720*a* having a thickness of 175 nm is formed so as to cover the first base insulating film 721 by using the sputtering method.

Figure 12B:
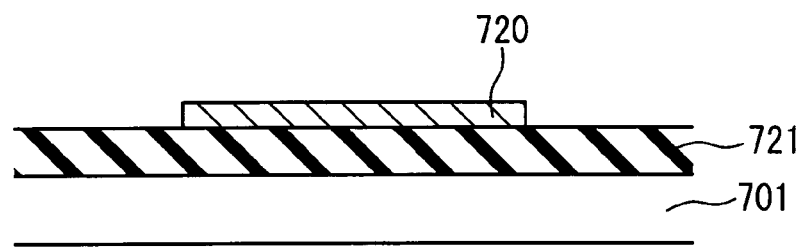

In succession, with reference to FIG. 12B, the typical photolithography technique and etching technique are used to pattern the tungsten silicide film 720*a* and consequently form the light shielding film 720.

Figure 12C:
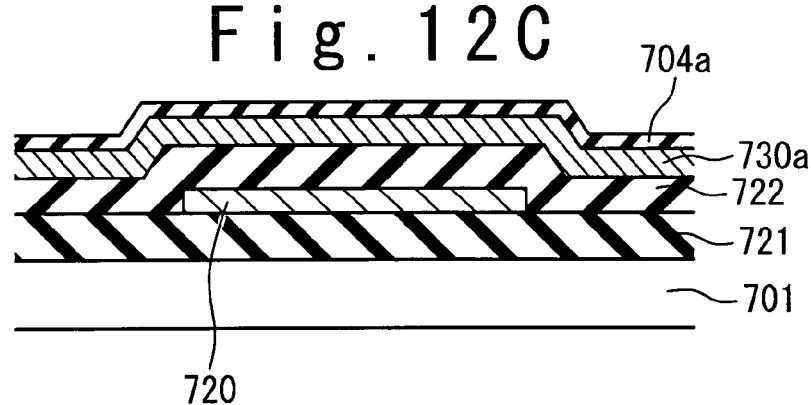

After that, with reference to FIG. 12C, by using the CVD method, the silicon oxide film having a thickness of 250 nm as the second base insulating film 722 is deposited so as to cover the light shielding film 720 and the first base insulating film 721. Next, by using the LPCVD method, the amorphous silicon film 730*a* having a thickness of 60 nm is deposited so as to cover the second base insulating film 722. In succession, the CVD method is used to deposit the silicon oxide film 704*a* having a thickness of 10 nm. After that, the amorphous silicon film 730*a* is crystallized by using the laser annealing method.

Figure 12D:
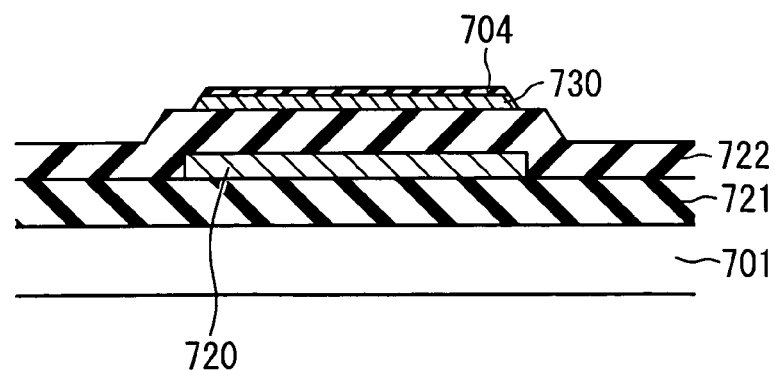

Next, with reference to FIG. 12D, the silicon oxide film 704 and the crystallized silicon film are patterned by the photolithography technique and the etching technique. In this way, the plurality of sets of the polysilicon film 730 and silicon oxide film 704 which function as the active layers of the thin film transistors are formed.

Here, as the etching condition, the mixture gas of $CF_4$ and $O_2$ is used as an etching gas. The total gas flow amount of $CF_4$ and $O_2$ is controlled to 200 sccm. The gas pressure is controlled to 20 Pa. Then, the RF power density is assumed to be 0.3 W/cm$^2$. The gas flow amount ratio of $CF_4$ and $O_2$ is assumed to be 115:85. Consequently, the portion where the taper angle of the sectional shape of the polysilicon film 730 is less than 40° can be substantially removed. Then, the taper angle can be set at the range from 40° and 60°.

Figure 13A:
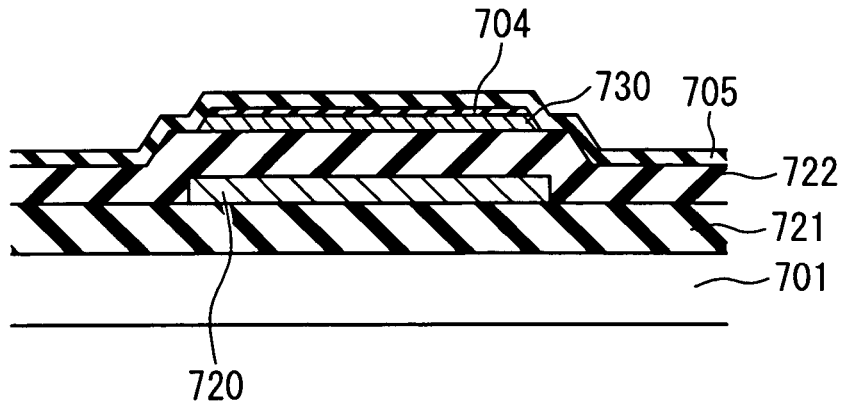
FIGS. 13A to 13C are cross-sectional views showing the method for manufacturing the liquid crystal light valve of the third embodiment.

Next, with reference to FIG. 13A, by using the CVD method, the silicon oxide film having a thickness of 90 nm as the gate insulating film 705 is deposited so as to cover the second base insulating film 722, the polysilicon film 730 and the silicon oxide film 704.

Figure 13B:
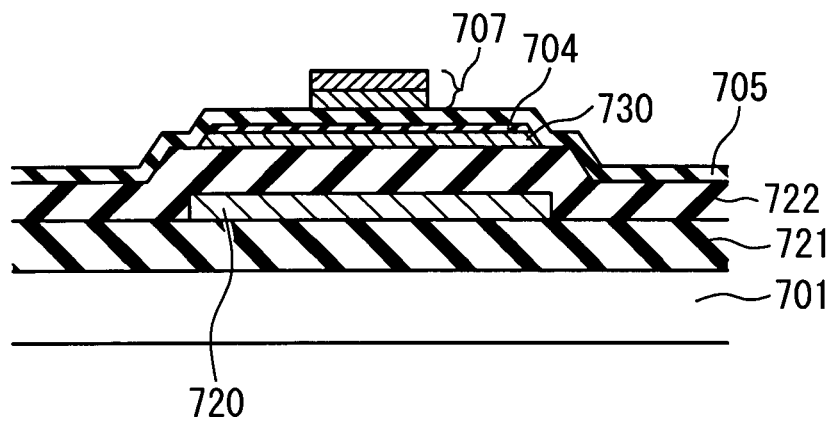

In succession, with reference to FIG. 13B, by using the CVD method, the polysilicon film (not shown) having a thickness of 100 nm is deposited where impurities are doped, so as to cover the gate insulating film 705. Moreover, by using the sputtering method, the tungsten silicide film (not shown) having a thickness of 150 nm is formed so as to cover the polysilicon film. After that, their films are patterned by the photolithography technique and the etching technique. Then, a plurality of gate lines 707, each of which crosses over each of a plurality of the polysilicon films 730, are formed.

Figure 13C:
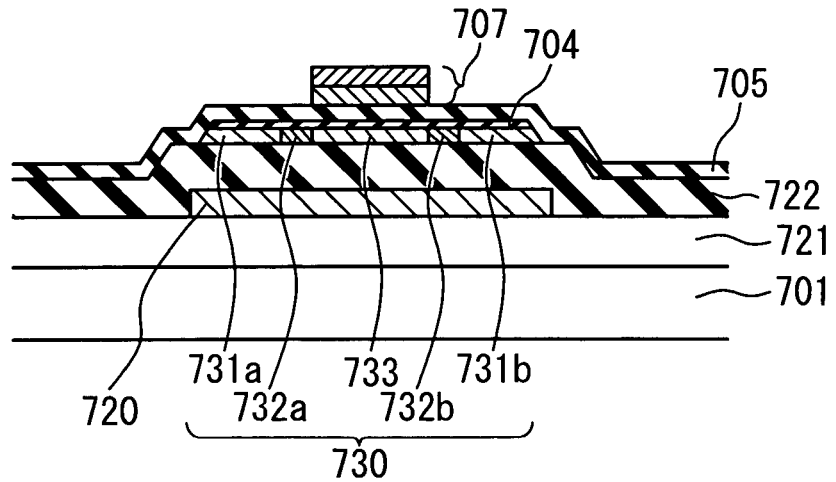

In succession, with reference to FIG. 13C, the dopant ions of a low concentration are selectively implanted into the predetermined positions of the polysilicon film 730 by an ion implantation method. Here, the gate line 707 is used as a mask. The predetermined positions are the portions serving as the source region 731*a*, the LDD regions 732*a*, 732*b* and the drain region 731*b*. Moreover, with the patterned photo resist film (not shown) as the mask, the dopant ions of a high concentration are selectively implanted into the predetermined positions of the polysilicon film 730. The predetermined positions are the portions serving as the source region 731*a* and the drain region 731*b*. In this way, the source region 731a, the LDD regions 732a, 732b, the channel region 733 and the drain region 731b are formed in the polysilicon film 730.

Next, by using the CVD method, the silicon oxide film having a thickness of 400 nm as the first interlayer insulating film 708 is formed so as to cover the gate line 707 and the gate insulating film 705. After that, the photolithography technique and the etching technique are used to selectively remove the first interlayer insulating film 708, the gate insulating film 705 and the silicon oxide film 704 for forming the contact hole 713. In the contact hole 713, the source region 731a is exposed. In succession, the sputtering method is used to form the aluminum film (not shown) having a thickness of 400 nm so as to cover the first interlayer insulating film 708. Then, the aluminum film is patterned by the photolithography technique and the etching technique so as to form a plurality of data lines 724. The data line 724 is also formed within the contact hole 713 and electrically connected to the source region 731a.

In succession, by using the CVD method, the silicon oxide film having a thickness of 400 nm as the second interlayer insulating film 709 is formed so as to cover the data line 724 and the first interlayer insulating film 708. Next, spin coating and heat curing are used to form the flattening film 706 so as to cover the second interlayer insulating film 709. After that, the photolithography technique and the etching technique are used to selectively remove the flattening film 706, the second interlayer insulating film 709, the first interlayer insulating film 708, the gate insulating film 705 and the silicon oxide film 704 for forming the contact hole 714. In the contact hole 714, the drain region 731b is exposed. After that, the sputtering method is used to form the ITO film (not shown) having a thickness of 100 nm so as to cover the flattening film 706. The ITO film is patterned by the photolithography technique and the etching technique so as to form a plurality of pixel electrodes 712. The pixel electrode 712 is also formed within the contact hole 714 and electrically connected to the drain region 731b. The TFT array substrate 770 of FIG. 11 is obtained by the above-mentioned steps.

Next, by using the sputtering method, the light shielding film (not shown) is formed so as to cover a different transparent substrate 750. The transparent substrate is patterned by the photolithography technique and the etching technique so as to form a plurality of black matrixes 751. Next, by using the sputtering method, the ITO film (not shown) is formed so as to cover different transparent substrate 750 and black matrix 751. Then, its ITO film is patterned by the photolithography technique and the etching technique so as to be a plurality of opposite electrodes 772. The opposite substrate 771 in FIG. 11 is obtained by this step.

Then, the TFT array substrate 770 and the opposite substrate 771 are stacked to each other, and the liquid crystal 780 is filled in the gap between them. Consequently, the liquid crystal light valve 700 in FIG. 11 is completed.

The method for suppressing the influence of the light on the thin film transistor will be described below in detail.

In FIG. 11, the light from a light source (not shown) is entered from an opening 772a on the above side of the opposite substrate 771 in FIG. 11. After that, the light is directed to the below side of the TFT array substrate 770 in FIG. 11 and transmitted through an opening 772b. Then, the light is projected onto a screen through an enlargement projecting optical system (not shown). The light on the incident side (the side of the transparent substrate 750) is shielded by the data line 724 and the black matrix 751 having the light shielding property, made of metallic thin film and the like. The non-transparent layer such as the layer constituting the other metallic wiring layer and pixel accumulation capacity may be used to configure the light shielding structure. On the other hand, the light (hereafter, also referred to as [Invasion Light]) reflected by the member of the enlargement projecting optical system is invaded from the outgoing side (the side of the transparent substrate 701). This is shielded by the light shielding film 720 arranged in the lower layer of the thin film transistor. In FIG. 11, the light shielding film 720 is the single layer film. However, depending on a case, it may be combined by two layers or more, or may be provided with the layer where a different kind material is stacked.

Since the invasion light is entered via the complex system, a distribution of incident angles is broadened. In order to suppress the invasion light from arriving at the thin film transistor, in particular, in order to shield the invasion light entered at a slant shallow angle, the following method is effective. The first method is to make the area of the light shielding film 720 wider. The second method is to make the light shielding film 720 closer to the polysilicon film 730. Those methods can decrease the range of incident angles, at which the lower surface of the polysilicon film 730 is viewed from the gap between the light shielding films 720, from the outgoing side. Consequently, it is possible to suppress the invasion light from arriving at the thin film transistor.

However, making the area of the light shielding film 720 wider shields the opening 772b, which reduces the transmittance (aperture ratio) of the liquid crystal light valve 700. Thus, the first method has the limit. Hence, the second method is applied for obtaining a better effect than that of the first method, making the light shielding film 720 closer to the polysilicon film 730.

The interval between the light shielding film 720 and the polysilicon film 730, namely, the thickness of the first base insulating film 721 is set to be about 1 μm or less in order to provide the above-mentioned effect. In order to make the light shielding much effective, as noted in Japanese Laid Open Patent Application JP-A 2003-131261 (Japanese patent application No. 2002-226054), the thickness of the first base insulating film 721 is preferable in the range from 500 nm to 1000 nm. Further preferably, it is in the range from 150 nm to 300 nm.

Since the light shielding film 720 needs to shield the light, it is usually made of a conductive material. If the light shielding film 720 is isolated in the insulating transparent substrate 701 and the insulating first base insulating film 721, the electric potential of the light shielding film 720 is not determined. For this reason, the element (not shown) to control the electric potential of the light shielding film 720 is provided inside or outside the TFT array substrate 770. The applied electric potential may be constant. In this case, the potential control is easy. The applied electric potential may be the voltage that is changed on the basis of the operation of the display. In this case, it can be operated in the safer and more stable manner.

However, if the light shielding film 720 is made closer to the lower surface of the polysilicon film 730 in order to increase the light shielding effect, the electric field caused by the electric potential of the light shielding film 720 influences the polysilicon film 730. In this case, the light shielding film 720 may carry out the action as a pseudo-gate electrode, which possibly has influence on the operation of the thin film transistor. The low limit of the thickness of the first base insulating film 721 as mentioned above is mainly set because of this reason.

The liquid crystal light valve 700 was produced. Here, the first base insulating film 721 between the light shielding film 720 and the polysilicon film 730 was made of the silicon oxide having a thickness of 250 nm. The polysilicon film 730 was formed based on the method of the first embodiment. Then, when this liquid crystal light valve 700 was operated, a white point defect was induced. In this case, the operation of the liquid crystal is normally white, and the pixel to which the voltage is applied is displayed black. The white point defect indicates that the voltage is not applied or the applied voltage is not held.

When the cause of the white point defect was researched, it was found that the brightness was changed depending on the voltage applied to the light shielding film 720. Also, when the similar research was performed on the liquid crystal light valve 700 manufactured by changing the etching condition of the polysilicon film 730, there was the case that the white point defect was not induced depending on the voltage range of the light shielding film 720. It was found that the voltage range had the relation to the etching condition of the polysilicon film 730. However, as causes of the white point defect, in addition to the cause targeted here, a plurality of different causes may induce the white point defect. However, if "white point defect" is described without any special notification in this specification, it points out only the cause where the brightness is changed depending on the potential applied to the light shielding film 720.

Figure 14:
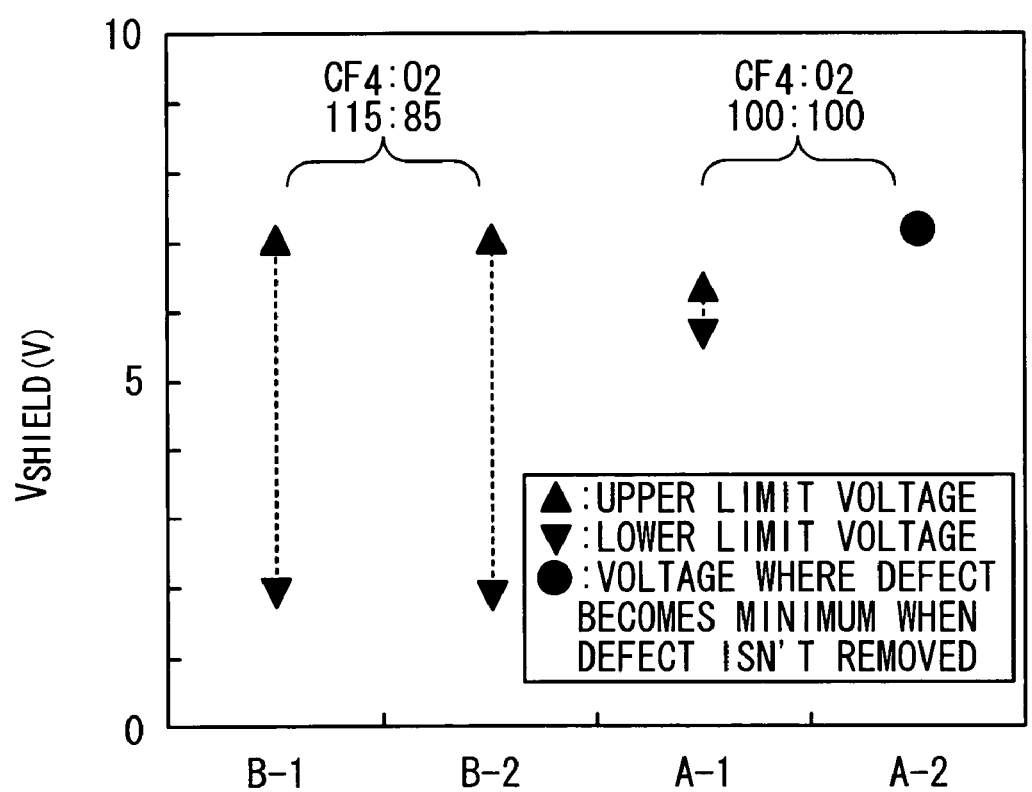
FIG. 14 is a graph showing the relation between the etching condition of the polysilicon film where the white point defect does not occur and the voltage applied to the light shielding film of the third embodiment.

The relation between the etching condition of the polysilicon film 730, the occurrence of the white point defect and the voltage applied to the light shielding film 720 will be described below. FIG. 14 is a graph showing the relation between the etching condition of the polysilicon film and the voltage applied to the light shielding film. The vertical axis indicates the voltage ($V_{SHIELD}$) applied to the light shielding film 720, and the horizontal axis indicates the sample names whose etching conditions are different from each other.

The polysilicon film 730 is obtained by stacking the silicon oxide film and the polysilicon film crystallized by the laser annealing method and then etching them into the shape of an island through photo-resist pattern. Samples A-1, A-2 are manufactured by setting the gas flow amount ratio of $CF_4$ and $O_2$ of the etching gas to 100:100 in continuously etching the silicon oxide film and the polysilicon film. Samples B-1, B-2 are manufactured by setting the gas flow amount ratio of $CF_4$ and $O_2$ to 115:85. The basic condition of the dry etching are set such that the total gas flow amount of $CF_4$ and $O_2$ is 200 sccm, the pressure is 20 Pa, and the introducing power density is 0.3 W/cm².

FIG. 14 shows the situation of the increase/decrease (occurrence/removal) of the white point defect when the voltage $V_{SHIELD}$ of the light shielding film 720 is changed while the liquid crystal light valve 700 is operated under a certain operation condition. Here, a solid triangle and a solid inverse triangle show the upper limit voltage and the lower limit voltage respectively in the range of the $V_{SHIELD}$ where the white point defect does not occur. A solid circle shows the voltage where the white point defect becomes minimum when the white point defect is not removed. As for the voltage at which the white point defect does not become visible, the upper limits are approximately constant in all of the samples. However, in the samples A-1, A-2, the allowable range exists in the very narrow range of 1V or less, or does not exist. In any case, it is found that this property is easily influenced by the variation in the manufacturing process. On the other hand, in the samples B-1, B-2, there is the allowable range of about 5 V. It is found that this property is not easily influenced by the variation in the manufacturing process. Moreover, although not shown in FIG. 14, it is found that there is the allowable range stably exceeding 10V in a different sample manufactured under the condition that the taper angle of the section is approximately 90°.

Figure 15:
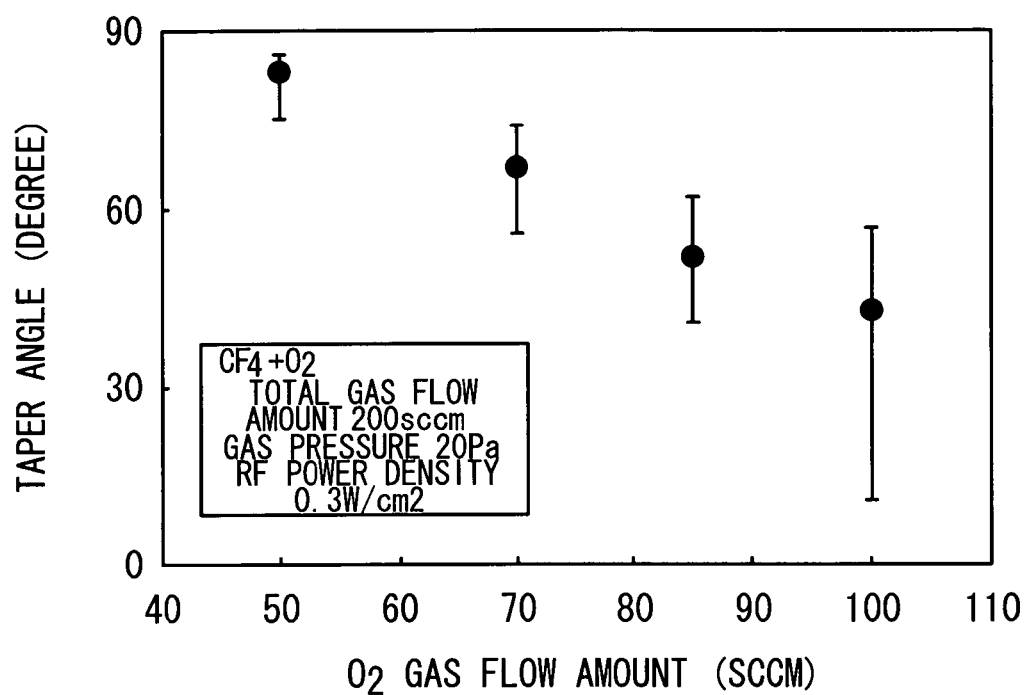
FIG. 15 is a graph indicating the relation between the $O_2$ gas flow amount in etching the polysilicon film and the taper angle of the section.

The relation between the etching condition of the polysilicon film 730 and the taper angle of the section will be described below. FIG. 15 is a graph indicating the relation between the $O_2$ gas flow amount in etching the polysilicon film and the taper angle of the section. The vertical axis indicates the taper angle, and the horizontal axis indicates the $O_2$ gas flow amount.

The etching condition of the polysilicon film 730 is changed by changing the gas flow amount ratio of $CF_4$ and $O_2$ of the etching gas in order to change the taper angle (the angle between the substrate surface and the sidewall surface of the etched film) of the polysilicon film 730. With reference to FIG. 15, in the typical example of the average taper angle, when the total gas pressure and the total gas flow amount of $CF_4$ and $O_2$ were constant, the higher the ratio of the gas flow amount of $O_2$, the smaller the taper angle (the tendency that the sidewall surface leans). On the contrary, the lower the ratio of the gas flow amount of $O_2$, the larger the taper angle (the tendency that the sidewall stands up). However, to observe the shape of the polysilicon film 730 in detail, when the number of observation points was increased, it was found that there was the portion departing from the average shape. In particular, when the gas flow amount ratio of $CF_4$ and $O_2$ is set to 100:100, the shape of the small taper angle (ex. less than 40°) is found although the number is low. This tendency is as indicated by an error bar of FIG. 15. That is, by changing the gas flow amount ratio of $CF_4$ and $O_2$ from the same amount 100:100 to the condition that the gas flow amount (ratio) of $O_2$ is small, the number of which the portion having the small taper angle is generated is sharply reduced.

The taper angle of the polysilicon film 730 is distributed under some range, depending on the position within the surface of the TFT array substrate 770. The polysilicon film crystallized by the laser annealing method as used here typically has the relatively large convex and concave portions on the surface. For this reason, the section shape (taper angle) is influenced by the position relation between the boundary of the pattern of the polysilicon film 730 and the convex and concave portion, and even the position relation between the boundary of the pattern and the grain boundary of the polysilicon film. Moreover, there are also the shape change and variation which are caused by all conditional changes that can not be controlled. Thus, the local taper angle is formed under a certain range. Because of the shape irregularity caused by the duplication of the above-mentioned conditions, when the gas flow amount ratio of $CF_4$ and $O_2$ is set to 100:100, the section shape having the small taper angle is generated in the substrate surface although the number is low.

In the sample manufactured by setting the gas flow amount ratio of $CF_4$ and $O_2$ of the etching gas to 100:100, the portion having the small taper angle of the section is generated although the number is low. Thus, because of the application voltage to the light shielding film 720, the white point defect is not removed, or the removal voltage range is very narrow. On the other hand, in the sample manufactured by setting the gas flow amount ratio of $CF_4$ and $O_2$ of the etching gas to 115:85, the taper angle of the average section becomes large. In addition, the portion where the taper angle is less than 40° is not found. The voltage range at which the white point defect is removed is relatively wide. Also, the sample manufactured in the further vertical section shape has the wider voltage allowance range. From those experiment results, the cause of the white point defect does not lie in the portion having the average taper angle. The cause lies in the portion having the small taper angle existing although the frequency is low in spite of the manufacturing under the same condition.

Thus, if the light shielding film 720 is effectively placed under the polysilicon film 730 constituting the thin film transistor, when the polysilicon film 730 is processed to the shape of the island, the dry etching should be carried out under the following condition. That is, the basic conditions are:

Total gas flow amount of $CF_4$ and $O_2$: 200 sccm

Gas pressure: 20 Pa

RF power density: 0.3 W/cm$^2$

The silicon oxide film and the crystallized polysilicon film are continuously etched under the condition in which an $O_2$ gas flow amount ratio of the etching gas is smaller than that of the mixture gas whose gas flow amount ratio of $CF_4$ and $O_2$ is 100:100. Consequently, the portion where the taper angle of the section is less than 40° can be substantially removed. Thus, the application voltage, applied to the light shielding film 720, can be controlled in the actually allowable range in which the occurrence of the white point defect can be suppressed.

Preferably, the gas flow amount ratio of $CF_4$ and $O_2$ should be set in the range from 110:90 to 120:80. Also, further preferably, the flow amount ratio of $CF_4$ and $O_2$ should be set to approximately 115:85. Consequently, the taper angle of the section of the polysilicon film 730 belongs to the range from about 40° and 60°. Thus, the preferable section shape can be obtained from the viewpoints of the coverage improvement and wiring disconnection protection of the gate line 707.

Incidentally, the white point defect as described here implies the mode where the brightness is changed depending on the application voltage to the light shielding film 720.

As mentioned above, the application of the method for forming the pattern of the stacked film in the present invention enables the taper angle of the section of the polysilicon film 730 to be controlled in the range from about 40° and 60°, in the structure having the light shielding film 720 in the lower layer of the polysilicon film 730. Thus, the gate line 707 crossing over the polysilicon film 730 can be formed in the excellent coverage. Consequently, it is possible to protect the wiring disconnection at the stepped portion caused by the polysilicon film 730 of the gate line 707. Moreover, the portion where the taper angle of the section of the polysilicon film 730 is less than 40° is removed, which enables the suppression in the occurrence of the white point defect that is caused by the voltage applied to the light shielding film 720.

As mentioned above, the method for forming the pattern of the stacked film in the present invention, after depositing the first oxide film, the semiconductor film and the second oxide film in turn on the substrate and laser-annealing the semiconductor film, forms the resist pattern on the second oxide film, uses this as the mask, and dry-etches the second oxide film and the semiconductor film, and then forms the pattern of the stacked film composed of the semiconductor film and the second oxide film. At this time, as the dry etching gas for the second oxide film and semiconductor film, the fluorine-based gas is used. At the time of the exposure of the first oxide film, the etching gas is switched from the fluorine-based gas to the chlorine-based gas. Here, the mixed gas of $CF_4$ and $O_2$ is preferably used as the fluorine gas. Preferably, the dry etching is carried out under the assumption that the gas flow amount ratio of $CF_4$ and $O_2$ is 1:1. Consequently, the taper angle of the second oxide film of the pattern of the stacked film can be made larger than the taper angle of the semiconductor film. Then, the taper angle of the second oxide film can be controlled to 45°<θ<60°, and the taper angle of the semiconductor film can be controlled to 10°<γ<60°. Thus, it is possible to protect the step cut of the wiring that crosses over this stacked film pattern.

Also, in the thin film transistor of the structure having the light shielding film in the lower layer of the island, with regard to the fluorine-based gas as the main dry etching gas used to form the pattern of the stacked film, the gas flow amount ratio of $CF_4$ and $O_2$ is designed such that $CF_4$ is larger than 1:1. Executing the dry etching under such condition can suppress the generation of the portion where the taper angle of the semiconductor film of the pattern of the stacked film is the small angle. Further preferably, the gas flow amount ratio of $CF_4$ and $O_2$ is set in the range from 110:90 to 120:80. Further preferably, the gas flow amount ratio of $CF_4$ and $O_2$ is set to approximately 115:85. Consequently, it is possible to substantially remove the generation of the portion where the taper angle of the semiconductor film is less than 40°, and the taper angle of the semiconductor film can be formed in the range from 40° to 60°. Consequently, it is possible to protect the wiring disconnection of the gate line that crosses over this. In addition, it is possible to suppress the influence on the operation of the thin film transistor that results from the potential of the light shielding film. Thus, when the thin film transistor manufactured by the method of the present invention is applied to the displaying device, the problems of the abnormal operation, the displaying defect and the like can be greatly reduced. Hence, the passed product rate and the reliability can be improved, and the cost can be reduced.

What is claimed is:

1. A method for forming a pattern of a stacked film, comprising:
    (a) forming sequentially a first base insulating film and a light shielding material on a transparent substrate;
    (b) patterning said light shielding material to obtain a light shielding film with a first pattern;
    (c) forming sequentially a second base insulating film, a semiconductor film and a first oxide film on a substrate;
    (d) forming a resist pattern with a second pattern on the first oxide film; and
    (e) forming a pattern of a stacked film including said semiconductor film and the first oxide film by dry etching the first oxide film and said semiconductor film, above said light shielding film,
    wherein said dry etching includes an etching by using an etching gas and said resist pattern as a mask, and
    said semiconductor film includes a taper angle which is controlled to be within predetermined range.

2. The method for forming a pattern of a stacked film according to claim 1, wherein said etching gas includes a mixture gas of $CF_4$ and $O_2$.

3. The method for forming a pattern of a stacked film according to claim 2, wherein an $O_2$ gas ratio of said etching gas is smaller than that of a mixture gas whose gas ratio of $CF_4$ and $O_2$ is 100:100.

4. The method for forming a pattern of a stacked film according to claim 3, wherein said step (e) includes:

(e1) forming said pattern of the stacked film such that said semiconductor film includes said taper angle in the range from 40° to 60°.

5. The method for forming a pattern of a stacked film according to claim 4, wherein a gas ratio of $CF_4$ and $O_2$ of said etching gas is in the range from 110:90 to 120:80.

6. The method for forming a pattern of a stacked film according to claim 5, wherein said gas ratio of $CF_4$ and $O_2$ of said etching gas is approximately 115:85.

7. The method for forming a pattern of a stacked film according to claim 3, wherein said step (c) includes:

(c1) forming an amorphous silicon film on said second base insulating film, and (c2) annealing said amorphous silicon film by a laser to obtain a polysilicon film as said semiconductor film.

8. The method for forming a pattern of a stacked film according to claim 3, wherein said step (c) includes:

(c3) forming an amorphous silicon film on said second base insulating film, (c4) forming said first oxide film on said amorphous silicon film, and (c5) annealing said amorphous silicon film by a laser to obtain a polysilicon film as said semiconductor film.

9. The method for forming a pattern of a stacked film according to claim 3, further comprises:

(f) forming a gate insulating film on said pattern of the stacked film; and (g) forming wiring on said gate insulating film, wherein said wiring crossing over said pattern of the stacked film.

10. The method for forming a pattern of a stacked film according to claim 8, wherein said wiring includes a metal selected from a group consisting of Cr, W, Mo, Ti, Ta and silicide films thereof.

* * * * *